(12) United States Patent
Watanabe et al.

(10) Patent No.: US 7,091,443 B2
(45) Date of Patent: Aug. 15, 2006

(54) HEATING DEVICE AND HEATING METHOD

(75) Inventors: Reiki Watanabe, Ibaraki (JP); Fumio Watanabe, Ibaraki (JP)

(73) Assignee: Vaclab, Inc., Tsukuba (JP)

( * ) Notice: Subject to any disclaimer, the term of this patent is extended or adjusted under 35 U.S.C. 154(b) by 0 days.

(21) Appl. No.: 10/831,658

(22) Filed: Apr. 26, 2004

(65) Prior Publication Data
US 2005/0000949 A1    Jan. 6, 2005

(30) Foreign Application Priority Data
May 2, 2003    (JP)    ............................. 2003-127038

(51) Int. Cl.
*B23K 10/00*    (2006.01)
(52) U.S. Cl. .............................. 219/121.52; 219/121.43
(58) Field of Classification Search ........... 219/121.52, 219/121.33, 121.43, 121.36, 76.16, 75, 85.16; 156/345.47; 422/186; 313/586, 619; 118/723 E, 118/723 ME, 723 I
See application file for complete search history.

(56) References Cited
U.S. PATENT DOCUMENTS
4,704,343 A * 11/1987 Yoshizawa ................... 430/66
4,998,968 A * 3/1991 Misumi ................... 118/723 E
5,851,600 A * 12/1998 Horiike et al. .............. 427/535

FOREIGN PATENT DOCUMENTS
JP    10-22069    1/1998

* cited by examiner

*Primary Examiner*—Quang Van
(74) *Attorney, Agent, or Firm*—Bacon & Thomas, PLLC

(57) ABSTRACT

A heating device includes a first electrode and a second electrode including a planar portion providing a support surface for supporting an object to be heated in an external gaseous atmosphere to which the object to be heated and the support surface are exposed. The second electrode is formed as an enclosure enclosing and spaced from at least a portion of first electrode to define an interior space therebetween isolated from the external gaseous atmosphere. An exhaust port provides communication with the interior space for reducing the pressure within the interior space. A power supplies current between the first and second electrodes to produce an electric discharge within the internal space, thereby heating the second electrode and the object supported thereon.

23 Claims, 15 Drawing Sheets

FIG. 3A
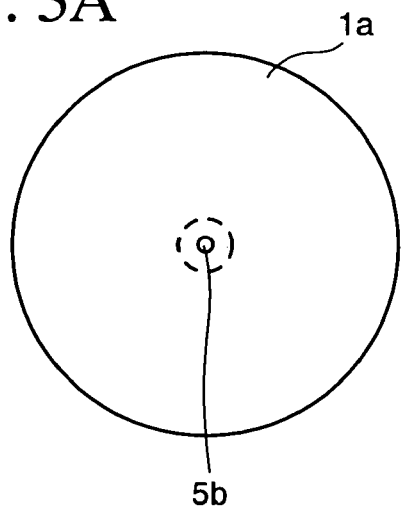
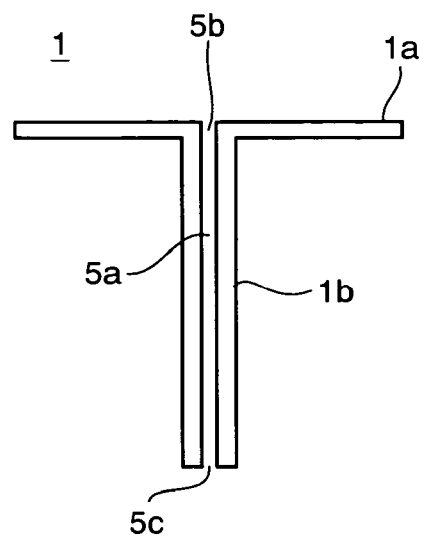
FIG. 3B
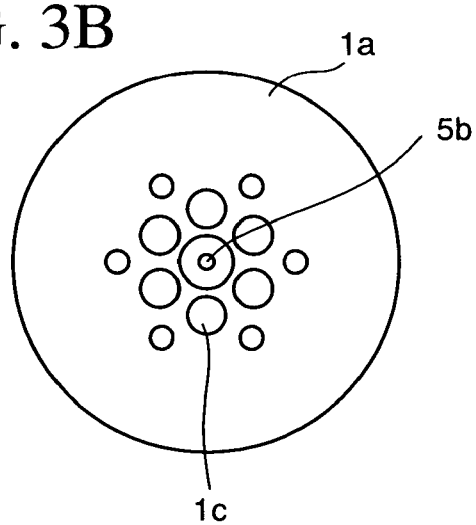
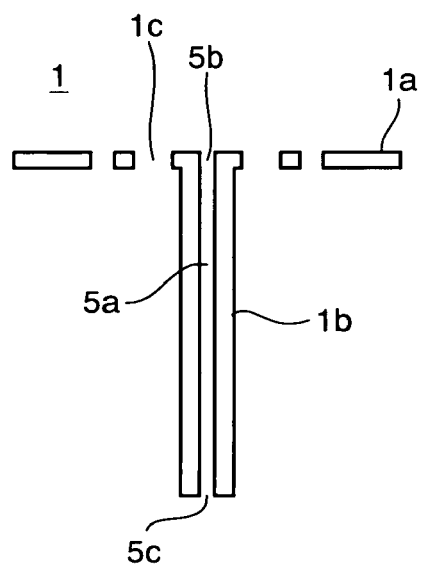

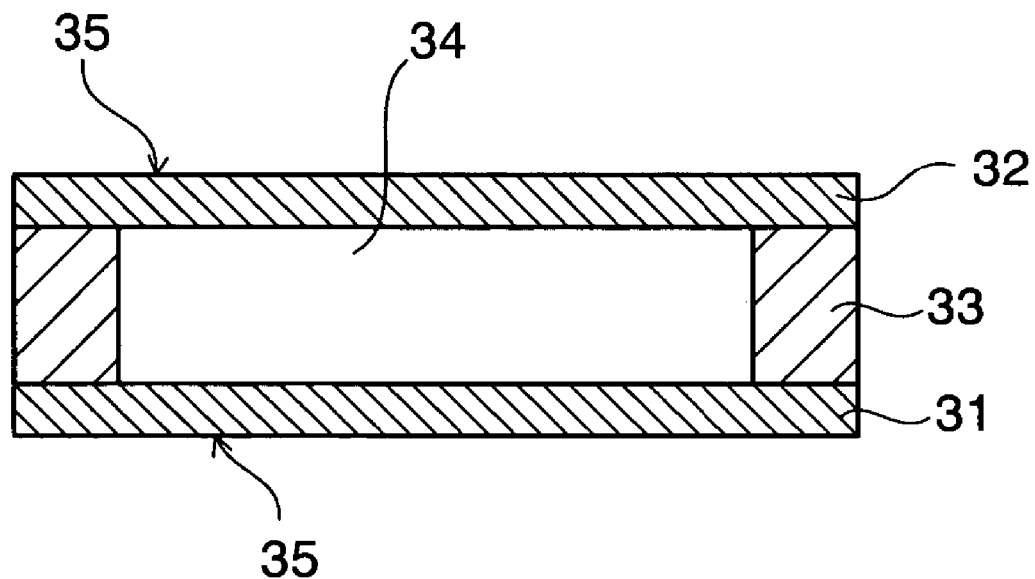
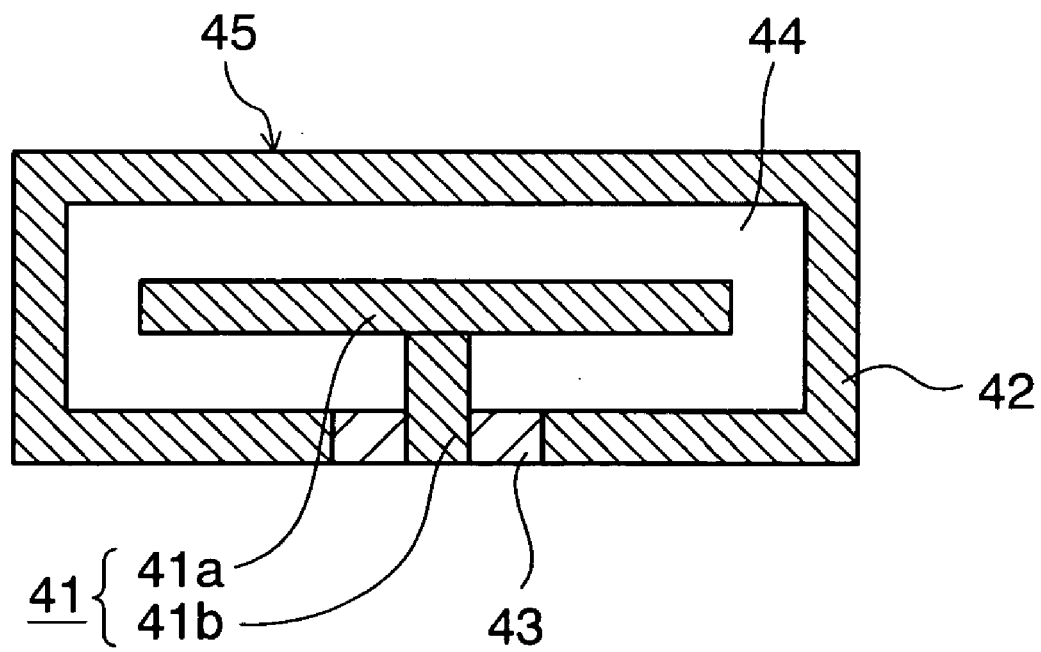

To Vacuum Pump

HEATING DEVICE AND HEATING METHOD

BACKGROUND OF THE INVENTION

Field of the Invention

The present invention relates to a heating device and a heating method, by which an object subject to heating is heated using glow discharge.

In manufacturing semiconductor devices, three heating systems of a resistive heating, a high-frequency induction heating, and a lamp heating have mainly been used comparing to the significant advance of processing technology in the recent years. Each of the three methods has good and bad points. Conventional batch type processing equipment for small diameter wafers has dealt with various problems by improving or combining the three heating systems.

Meanwhile, a wafer size has become very large as 300 mm and it has been difficult for the batch type processing equipment to deal with. For this reason, a single wafer type has been studied and adopted, where the wafers are processed by one piece in the process of oxidation, diffusion, epitaxial growth, annealing, and the like. Under such circumstances, a heating device used in single wafer type equipment for executing the above-described process is required to satisfy all the following strict conditions. The conditions are:
(i) Capability of generating high temperature around 1000° C.;
(ii) Uniform in-plane temperature distribution;
(iii) No heavy metal contamination since high temperature is required;
(iv) No strain applied to wafers during high temperature treatment;
(v) Capability of realizing temperature increasing/decreasing rate of 50° C./min or more;
(vi) Capability of improving power saving.

To satisfy the conditions, studies are performed for improving the conventional three heating systems and for various heating devices of new heating systems. The heating device described in patent document 1 is a heating device of a new heating system using glow discharge.

[Patent Document 1]

Japanese Patent Laid-open Hei 10-22069 publication

However, the conventional three heating systems have the following disadvantages.
(a) In the resistive heating system, the temperature of internal heating resistance wire exceeds 1000° C. to obtain the heater surface temperature of 700° C. or higher, which tends to cause breaking of wire, or a problem of insulation failure occurs, which leads to metal contamination and relatively large radiation loss.
(b) In the high-frequency induction heating system, the temperature distribution tends to be non-uniform in a large substrate. A dummy heating section (only a central portion can be used) needs to be larger in order to make the distribution uniform, which requires a large electric power. Consequently, a radio wave interference which may be caused by the large electric power prevents the application of the system to a plasma CVD apparatus.
(c) In the lamp heating system, temperature distribution tends to be non-uniform, because radiation ratio varies depending on a substrate surface status, and energy consumption is large because heat quantity lost by reflection increases as temperature rises.

As described above, it is difficult for each heating system to satisfy the above-described conditions (i) to (vi), and further improvement is not expected because technical improvement is in a saturated state.

Further, in the heating device by the new heating system using conventional glow discharge, heat from a tube shaped in a Geissler tube is utilized. The tube does not have good thermal conversion efficiency of energy and is not suitable for substrate heating in a single wafer type semiconductor equipment.

SUMMARY OF THE INVENTION

It is an object of the present invention to provide a heating device and a heating method, which has good thermal conversion efficiency of energy, high uniformity of the temperature distribution, obtains high temperature, and is suitable for substrate heating of the single wafer type semiconductor equipment.

A first heating device of the present invention comprises a structural body having a first conductive substance and a second conductive substance provided so as to surround the first conductive substance, in which they form a space substantially isolated from outside air. Since the space isolated from outside air is not previously decompressed, the heating device has an exhaust port for decompressing the space. Further, the heating device may be provided with a gas supply port that supplies gas for electric discharge, which is at least one of helium, neon, argon, krypton, xenon, hydrogen, nitrogen, carbon dioxide or air for example, in addition to the exhaust port.

In the first heating device, since the space isolated from outside air (includes decompressed outside air) is not previously decompressed, decompression of the space isolated from outside air is performed simply by exhausting it from the exhaust port, or by exhausting it from the exhaust port while the gas for electric discharge is supplied from the gas supply port. In addition, the exhaust port and the gas supply port may be replaced with each other. Next, direct current power is applied between the first conductive substance and the second conductive substance such that the voltage of the second conductive substance becomes higher than the voltage of the first conductive substance, for example, in order to cause electric discharge in the decompressed space and thus dissociate the gas in the space into electrons and ions. In this case, the pressure of the decompressed space is set to the range from 10 Pa to 1000 Pa, for example. Consequently, the gas for electric discharge in the decompressed space comes into glow discharge and thus a part of gas molecules dissociates into electrons and ions, and then the glow discharge is maintained.

When the direct current power is applied, electrons are drawn to and collide the second conductive substance to which high voltage has been applied, and energy conversion is performed from electrons to the second conductive substance. On the other hand, ions are drawn to and collide the first conductive substance to which low voltage has been applied, and energy conversion is performed from ions to the conductive substance. This allows the temperature of the first and second conductive substances to increase. Furthermore, when the temperature of the first conductive substance exceeds temperature equivalent to the work function of the material, hot electrons are generated from the conductive substance itself, so that electron amount in the space exceeds electron amount generated only by the electrolytic dissociation of gas. Accordingly, by increasing an applied power, the temperature of the first and second conductive substances can be readily increased to reachable temperature at the maximum. The reachable temperature is determined by fusion or structure change of material.

On the other hand, when alternating current power is applied, the temperature of the first and second conductive substances increases to high temperature in the nearly same manner since energy is imparted to them alternately from electrons and ions. In this case, although the thermo-electronic effect is not expected much, the temperature of the first and second conductive substances can be easily increased to high substrate-heating temperature by increasing the applied power, similar to the case of the direct current application.

The second conductive substance whose surface is exposed to the outside is used as means for heating an object (a substrate) subject to heating out of the first and second conductive substances whose temperature has been increased. This is capable of readily obtaining the substrate-heating temperature of a range from the normal temperature to 1000° C. or higher.

Further, since the second conductive substance is used as means for heating the substrate, the conductive substance itself can be used as a mount section for the substrate. Thus, it is possible to provide the heating device suitable for heating the substrate in semiconductor-manufacturing apparatus of the single wafer type. In this case, a through hole communicating to the space is formed in the conductive substance of the mount section for the substrate, the substrate is mounted on the mount section, and then the space is exhausted, so that the substrate can be fixed by pressure difference via the through hole.

Further, it is not a system using hot cathode such that electrons are generated from metal by heating through power application from another power source, but a system for generating electrons and ions by discharging gas in the space, so that a two-electrode constitution is enough and 100% of input power can be used for thermal conversion with a minimum electrode constitution. In addition, since either one of electrons and ions directly impart energy to the conductive substance that is the means for heating the object, the thermal conversion efficiency of energy is good. This realizes power saving and makes the device smaller.

Moreover, the device uses energy conversion by the collision of electrons and ions generated in the space between the first conductive substance and the second conductive substance. Therefore, by adjusting the shape of the inner first conductive substance out of the first and second conductive substances, it is capable of adjusting discharge intensity, and thus adjusting the collision distribution of electrons and ions relatively easily. Consequently, temperature distribution having high uniformity is obtained relatively easily.

Further, there is a case such that a structural body that constitutes the first heating device has a leading-out section for leading the first conductive substance outside the second conductive substance via the first conductive substance itself or a leading-out conductive substance, and an insulator to insulate the first conductive substance from the second conductive substance in the leading-out section. In this case, there is a fear such that conductive particles sputtered from the first conductive substance or the like by electric discharge could adhere to the surface of the insulator exposed in the space between the first conductive substance or the leading-out conductive substance and the second conductive substance. In this case, by providing concavo-convex on the surface of the insulator exposed to the space, it is possible to lengthen the surface distance of the insulator, which ranges from the first conductive substance or the leading-out conductive substance to the second conductive substance, and thus to prevent deposit from becoming continuous thin film conductive substance on an insulator surface. This results in suppressing leakage current that could be generated between opposing conductive substances via the adhered matter.

A second heating device of the present invention comprises a structural body. The body has the first conductive substance, the second conductive substance provided so as to surround the first conductive substance except for the leading-out section for leading the first conductive substance outside the second conductive substance via the first conductive substance itself or the leading-out conductive substance, and the insulator that insulates the first conductive substance from the second conductive substance on the leading-out section. Their elements form a space substantially isolated (sealed hermetically) from outside air and the space is previously decompressed.

In the second heating device, unlike the first heating device, the space isolated from outside air is previously decompressed. Then, similar to the first heating device, direct current or alternating current power is applied between the first conductive substance and the second conductive substance to cause electric discharge of gas inside the decompressed space, and then the discharge is maintained to increase the temperature of the first and second conductive substances. In this case, the second conductive substance exposed to outside air is used as the means for heating the object subject to heating.

As described above, the second heating device, as well, can improve the thermal conversion efficiency of energy, increase the uniformity of temperature distribution, and increase the substrate-heating temperature in the same manner as the first heating device. Further, unlike the first heating device, the second heating device has the structural body having the space isolated from outside air and previously decompressed, and thus it can be used as a so-called portable heating device.

In the first and second heating devices, the first conductive substance has a material with a small work function of electron radiation. The material is exposed on a surface facing the space. By using the first conductive substance as a cathode electrode, supply of electrons into a discharging space is increased, and the thermal conversion efficiency of energy can be further improved. Specifically, since the second conductive substance contacts outside air and the object subject to heating, heat generated in the second conductive substance is lost into outside air as radiation energy or lost by conducting to the object. Further, the first conductive substance is surrounded by the second conductive substance. Accordingly, although the temperature of both the second conductive substance and the first conductive substance rises, the temperature of the first conductive substance becomes higher than the second conductive substance. Moreover, secondary electrons is generated from the cathode electrode by ion bombardment and electron emission occurs more easily from the conductive substance having higher temperature. Therefore, by using the inner first conductive substance as a negative electrode (cathode electrode), thermoelectronic emission easily occurs and the hot electrons accelerate electrolytic dissociation, and thus electron flow increases to facilitate electric current flow. Consequently, since it is possible to efficiently increase the temperature of the second conductive substance with lower power, then the thermal conversion efficiency of energy is good and high response is obtained.

Moreover, the second conductive substance is a heat-resistant substance on which a heat-resistant and dense film is coated. Meanwhile, graphite can be used as the heat-resistant substrate, for example. Graphite is a high-temperature material resistant to heat of 1000° C. or higher, but regular graphite is porous and cannot maintain airtightness of the discharging space. Therefore, a graphite film or an SiC film, which are a heat-resistant and dense film, is coated on the surface of the second conductive substance exposed to outside air, and thus the airtightness of the discharging space inside the second conductive substance is maintained. Consequently, the present invention can provide a heater that heat resistance is improved while an inner pressure is maintained in a state where electric discharge occurs continuously.

Furthermore, in the second heating device that generates electric discharge in a space previously decompressed and being impossible to exhaust, adsorbent for gas other than the gas for electric discharge may be specially provided in the space. The gas is generated from the conductive substance by electric discharge and reduces the degree of vacuum in the space. The gas can be adsorbed by the adsorbent, and thus the pressure of the space can be maintained at pressure suitable for electric discharge.

A third heating device of the present invention comprises a structural body having the first conductive substance, the second conductive substance facing the first conductive substance, and the insulator that insulates the first conductive substance from the second conductive substance, and their elements form a space substantially isolated from outside air. In this case, at least one of the first conductive substance and the second conductive substance is exposed to outside air and it is used as the substrate-heating means.

The space isolated from outside air is not previously decompressed, and thus the heating device is provided with the exhaust port for decompressing the space. The heating device may be provided with the gas supply port that supplies the gas for electric discharge, which is at least one of helium, neon, argon, krypton, xenon, hydrogen, nitrogen, carbon dioxide or air for example, in addition to the exhaust port.

Then, in the third heating device, since the space isolated from outside air is not previously decompressed similar to the first heating device, decompression is performed simply by exhausting the space isolated from outside air from the exhaust port, or by exhausting the space isolated from outside air from the exhaust port while the gas for electric discharge is supplied from the gas supply port. Next, direct current or alternating current power is applied between the first conductive substance and the second conductive substance to cause electric discharge of the gas in the decompressed space, and then discharge is maintained to increase the temperature of the first and second conductive substances. When both the first conductive substance and the second conductive substance are exposed to outside air, at least one of the first conductive substance and the second conductive substance can be used as the means for heating the object subject to heating.

When direct current power is applied, electrons perform energy conversion to a conductive substance used as an anode, and ions perform energy conversion to a conductive substance used as a cathode, severally. Thus, the temperature of the first and second conductive substances is increased. On the other hand, when alternating current power is applied, since electrons and ions alternately impart energy to both the first and second conductive substances, the temperature is increased to high temperature similarly.

In this case, because at least either one of the first and second conductive substances is exposed to outside air, higher substrate-heating temperature of 1000° C. or higher can be readily obtained by using the both or either one of the conductive substances as the heating means for the object.

As described, the third heating device can improve the thermal conversion efficiency of energy, increase the uniformity of temperature distribution, and increase the substrate-heating temperature in the same manner as the first heating device. Further, it is possible to provide the heating device suitable for heating the substrate in the apparatus of a single wafer type for manufacturing semiconductor device, similar to the first heating device.

In a fourth heating device of the present invention, the space isolated from outside air is previously decompressed unlike the above-described third heating device.

In the fourth heating device, since the space isolated from outside air is previously decompressed in the similar manner as the second heating device, direct current or alternating current power is directly applied between the first conductive substance and the second conductive substance to cause electric discharge in the decompressed space and then the discharge is maintained. Then, the temperature of the first and second conductive substances rises by maintaining the discharge. Therefore, at least one of the first conductive substance and the second conductive substance can be used as the means for heating the object.

As described above, according to the fourth heating device, the thermal conversion efficiency of energy is improved, the uniformity of temperature distribution is increased, and the substrate-heating temperature can be increased in the same manner as the first heating device. Furthermore, since the device has a structural body having the space isolated from outside air and previously decompressed similar to the second heating device, it is useful for the so-called portable heating device.

In the third and fourth heating devices, a conductive substance used as the cathode electrode out of the first conductive substance and the second conductive substance has a material having a small work function of electron radiation, and it is exposed on a surface facing the space. Thus, since the supply of electrons is increased similar to the above-described first and second heating devices, the thermal conversion efficiency of energy can be further improved.

Still further, at least one of the first conductive substance and the second conductive substance is the heat-resistant substance on which a dense film having heat resistance is coated. Therefore, even when at least one of the first conductive substance and the second conductive substance is exposed to outside air, the heat resistance can be improved similar to the above-described first and second heating devices, and the pressure in the discharging space can be stabilized without being affected by external pressure variation.

BRIEF DESCRIPTION OF THE DRAWINGS

FIG. 3 is a view showing the constitution of a cathode electrode of the heating device according to the first embodiment of the present invention, wherein the left drawings of FIGS. 3A and 3B are top views thereof, and the right drawings of FIGS. 3A and 3B are sectional views thereof;

FIG. 12 is a side sectional view showing the entire constitution of the heating device according to a sixth embodiment of the present invention;

FIG. 14 is a side sectional view showing the entire constitution of the heating device according to an eighth embodiment of the present invention;

DESCRIPTION OF THE PREFERRED EMBODIMENTS

Embodiments of the present invention will be explained with reference to the drawings hereinafter.

First Embodiment (i) The Constitution of the Heating Device

Figure 1:
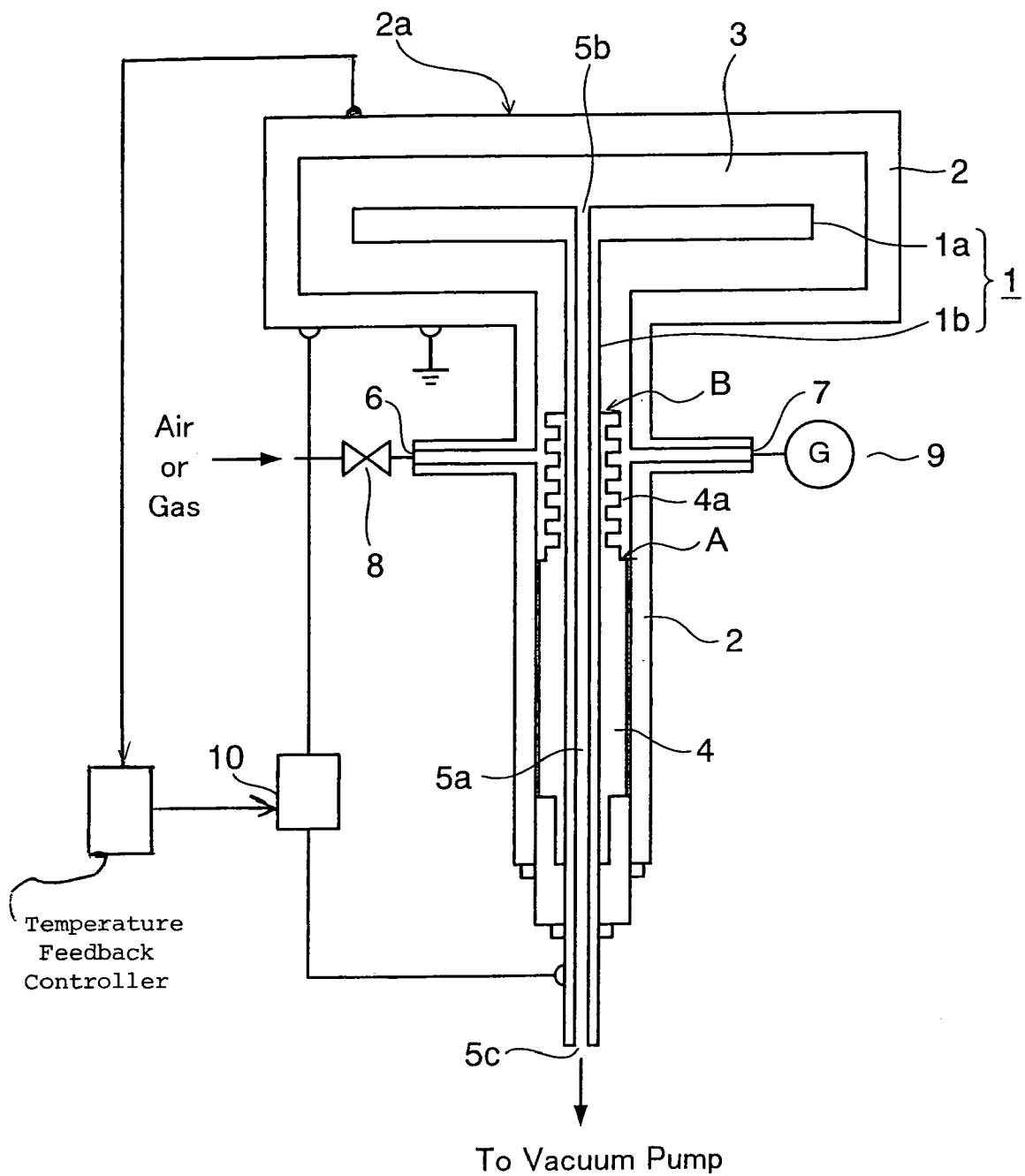
FIG. 1 is a side sectional view showing the entire constitution of the heating device according to a first embodiment of the present invention.
Figure 2:
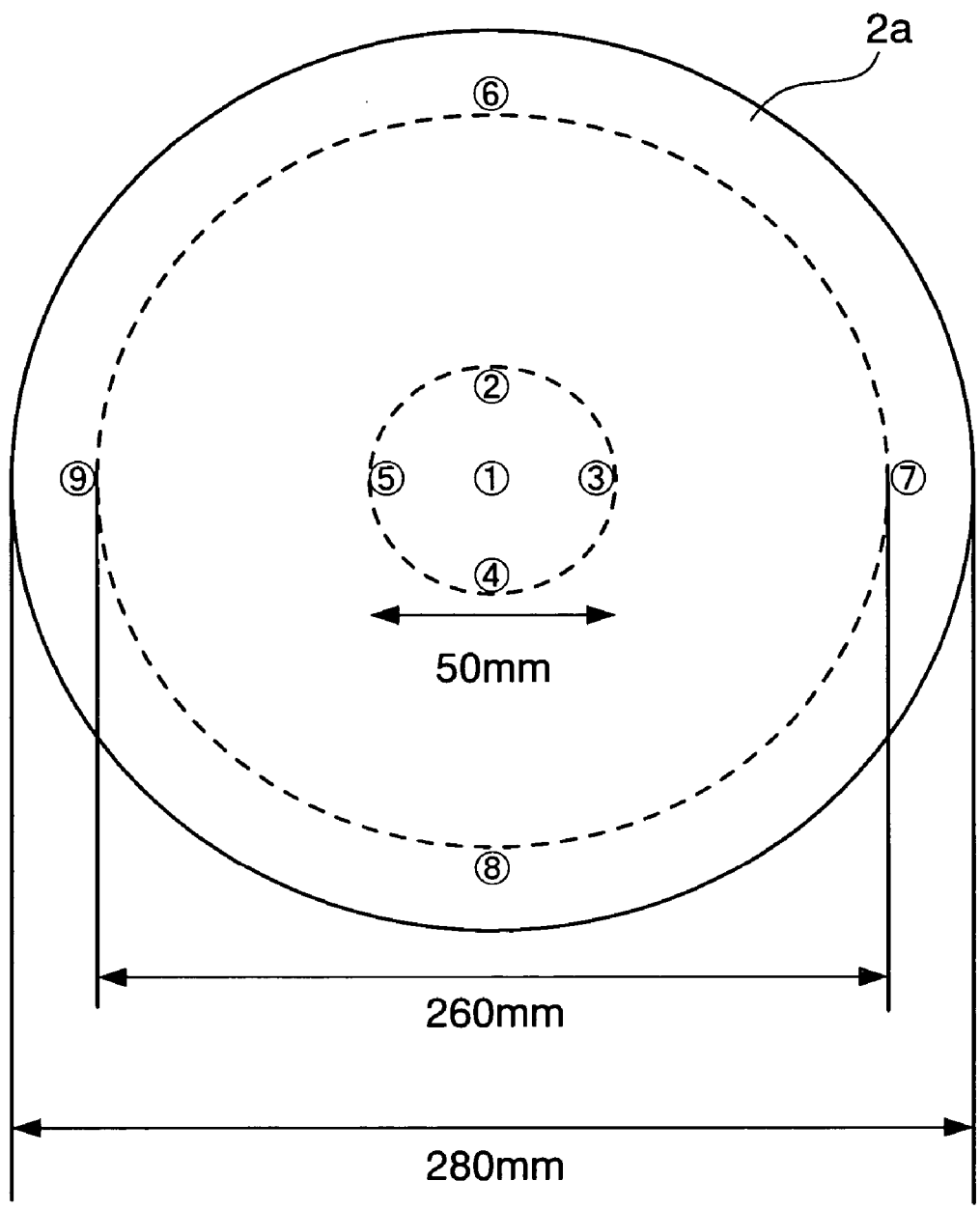
FIG. 2 is a top view showing a mount surface for a substrate of the heating device according to the first embodiment of the present invention.

FIG. 1 is the side sectional view showing the entire constitution of the heating device according to the first embodiment of the present invention, and FIG. 2 is the top view of the heating device. FIG. 3A is the view showing the structure of the cathode electrode, where the left view and the right view are the top view and the side sectional view, respectively. Note that the first conductive substance and the second conductive substance are respectively referred to as a cathode electrode 1 and an anode electrode 2 because the following explanation is made on the assumption that direct current power is applied, but the names specified as the cathode electrode 1 and the anode electrode 2 are not appropriate in the case where alternating current power is applied.

The entire constitution of the heating device includes, as shown in FIG. 1, a cathode electrode (a first conductive substance) 1, and an anode electrode (a second conductive substance) 2 provided so as to surround the cathode electrode 1 and form a space 3 isolated from outside air inside thereof.

The cathode electrode 1 has a mushroom shape including a disc-shaped conductive plate (a plate-shaped conductive substance) 1a and a column-shaped conductive rod (a post-shaped conductive substance) 1b, as shown in FIG. 3A. An exhaust pipe 5a passing through the central portion of the column-shaped conductive rod 1b of the cathode electrode 1 is provided. The exhaust pipe 5a is open to the space 3 above the disc-shaped conductive plate 1a via a through hole 5b formed in the disc-shaped conductive plate 1a at one end and it is connected to an exhaust port 5c at another end. Exhaust means such as a vacuum pump is connected to the exhaust port 5c.

Note that an electrode as shown in FIG. 3B may be used as the cathode electrode 1. The left one and the right one of the drawing are a top view and a side sectional view, respectively. At least one or more through holes 1c are provided for the disc-shaped conductive plate 1a of the cathode electrode 1. The discharge intensity distribution can be adjusted by providing the through holes 1c. Therefore, the through holes 1c are distributed appropriately within the disc-shaped conductive plate 1a to adjust the discharge intensity distribution, by which the temperature distribution of an outer surface of the disc-shaped conductive plate 1a, particularly a mount section 2a for an object subject to heating, can be adjusted. Moreover, a needle-shaped protrusion is provided on a part of the cathode electrode 1 (periphery side portion of mushroom umbrella, for example) and an electromotive electrode (not shown) for triggering electric discharge can be devised. This is because field emission is allowed to easily occur by concentration of electric field on a pointed portion of the cathode.

The anode electrode 2 is provided along the mushroom-shaped cathode electrode 1 so as to surround it as shown in FIG. 1. Further, the anode electrode 2 is provided so as to be opposed to the cathode electrode 1 with an appropriate interval. Then, the surface of the anode electrode 2 above the top surface of the disc-shaped conductive plate 1a of the cathode electrode 1 is the mount section 2a for the object subject to heating as shown in FIG. 2. The object subject to heating may be directly mounted on the mount section 2a or may be mounted on it via an insulator. Generally, the insulator can be omitted by connecting the anode electrode 2 to the ground.

Furthermore, an insulator 4 is one of boron nitride (BN), alumina ceramic, quartz and the like. The insulator 4 is put in a space between the column-shaped conductive rod 1b, which corresponds to a stem portion of the mushroom shape of the cathode electrode 1, and the anode electrode 2 opposed to the column-shaped conductive rod 1b. Thus it prevents electric discharge from occurring at this area. The insulator 4 also has a function to isolate the space 3 between the electrodes 1, 2 from outside air. The insulator 4 may be formed into a portion contacting the space and a portion contacting outside air as shown in FIG. 1, or may be formed integrally. Moreover, conductive particles sputtered from the electrodes 1, 2 by electric charge adhere to the surface of the insulator 4 exposed to the space between the electrodes 1, 2, and thus leakage current occurs between the opposing electrodes 1, 2 via the adhered matter. To suppress the leakage current, concavo-convex portions 4a are formed on the surface of the insulator 4 exposed to the space 3 between the electrodes 1, 2, and thus lengthen the surface distance of the insulator 4, which ranges from a sidewall inner surface (A) of the anode electrode 2 to a surface (B) of the column-shaped conductive rod 1b of the cathode electrode 1. With this, the deposit is prevented from becoming a continuous thin film conductive substance.

Furthermore, the sidewall of the anode electrode 2, which is opposed to the surface of the column-shaped conductive rod 1b corresponding to the stem of the mushroom shape of the cathode electrode 1, is provided with a gas supply port 6 for supplying gas for electric discharge into the space 3 between the electrodes 1, 2. The gas supply port 6 is connected to a supply source of gas for electric discharge via a variable leakage valve 8 or the like. As gas for electric discharge, at least one of noble gas such as helium, neon, argon, krypton and xenon, hydrogen, nitrogen, carbon dioxide and air is used. By performing exhaust while gas for electric discharge is supplied, or by simply performing exhaust without introducing gas for electric discharge, the space 3 between the electrodes 1, 2 is decompressed into the range from 10 Pa to 1000 Pa, for example, which is necessary pressure for glow discharge. CO and $CO_2$ is generated from the inside of electrodes by sputtering phenomenon or temperature increase, particularly when gas in a discharging space is air containing oxygen and carbon and electrodes are used. On the other hand, by arranging the gas supply port 6 as described above, there can be created gas flow from the gas supply port 6 to the exhaust pipe 5a provided for the cathode electrode 1 so as to carry out CO and $CO_2$ by the gas flow. Note that the positions of the exhaust port 5c and the gas supply port 6 may be replaced by each other, they may be limitedly arranged only on the cathode electrode 1, the anode electrode 2 or a part of the insulator 4. Further, the exhaust pipe 5c and the gas supply port 6 are united to use a T-tube, and thus pressure may be adjusted there. In this case, the column-shaped conductive rod 1b is not provided with the exhaust pipe and it may be simply a rod.

Further, an opening 7 for connecting to a diaphragm (vacuum) gauge 9, which is used for measuring the degree of vacuum of the space 3 between the electrodes 1, 2, is provided for the sidewall of the anode electrode 2, which opposes to the surface of the column-shaped conductive rod 1b of the cathode electrode 1.

Furthermore, the heating device has a power supply source 10 supplying direct current or alternating current power between the anode electrode 2 and the cathode electrode 1. The power supply source 10 has power supply capacity, which is capable of applying power of 100V to 1000V and allowing electric current flow caused by electric discharge generated by voltage application. Still further, heat measurement means (thermocouple thermometer) is attached to a part of the anode electrode 2 to measure temperature, and a feedback circuit (not shown) for controlling the current intensity of the supply power source is provided to keep the substrate heating temperature at a constant level.

Regarding the connection of the power supply source 10 between the anode electrode 2 and the cathode electrode 1, a positive output terminal of the power supply source is connected to the anode electrode 2 and a negative output terminal is connected to the cathode electrode 1 inside the space 3, generally. This is because thermoelectronic emission occurs but thermoionic emission does not occur. Although the application of direct current power increases the temperature of both the anode electrode 2 and the cathode electrode 1, the temperature of the anode electrode 2, which is exposed to outside air, tends to be lower than that of the cathode electrode 1. This is due to the following reason. Specifically, since the anode electrode 2 contacts outside air and the object subject to heating, heat generated in the anode electrode 2 is lost into outside air in emission energy and lost by conducting to the object subject to heating. Further, the temperature of both the anode electrode 2 and the cathode electrode 1 increases. In this case, since the cathode electrode is surrounded by the anode electrode 2, the temperature of the cathode electrode becomes higher than that of the anode electrode 2. Further, according to experiment, it is possible to increase the temperature of both electrodes in either case where the cathode electrode 1 is located either inside or outside, but electric discharge tends to occur more stably when the inner electrode is a negative electrode (cathode electrode) than an opposite case. This is due to the following reason. Specifically, ion bombardment allows the cathode electrode 1 generate secondary electrons, which makes the temperature of the inside of the heating device higher than the outside and electron emission occurs more easily from a higher temperature side. Therefore, the secondary electron emission and thermoelectronic emission by ion bombardment occur more easily when the inner electrode is the negative electrode (cathode electrode 1), and the electrons accelerate electrolytic dissociation and increase electron flow to make current flow more easily than a case such that only electric discharge occurs. Moreover, this makes it possible to generate more stable electric discharge at a lower power when the inner electrode is the negative electrode (cathode electrode 1). It has good heat exchange efficiency of energy.

On the other hand, in the case of alternating current power, the effect of thermoelectrons is not expected much, but the arrangement of the anode electrode and the cathode electrode is not particularly limited. Since the application of alternating current power allows electrons and ions alternately collide each of the anode electrode 2 and cathode electrode 1, the temperature of both the cathode electrode 1 and the anode electrode 2 is elevated. In this case as well, when the electrodes are arranged as shown in FIG. 1 and FIG. 2, the temperature of the cathode electrode 1 becomes higher than that of the anode electrode 2 because the cathode electrode 1 is surrounded by the anode electrode 2. Then, by adjusting applied power, a very wide heating temperature range from normal temperature to several thousand ° C. can be obtained.

This kind of heating device is provided with the cathode electrode 1 made up of a material having a small work function such as thoriated tungsten, yttrium oxide sintered body, lanthanum boride crystal, thorium oxide, complex of yttrium oxide, carbon and conductive ceramic, and carbon element itself, for example. Alternatively, it is preferable to use the electrode in which thorium oxide, yttrium oxide, barium oxide, calcium oxide or potassium oxide, for example, is coated on a high-melting material such as titanium, tungsten, tantalum, rhenium, molybdenum, iridium, hafnium, particularly on a surface thereof opposing to discharging space.

Therefore, the supply of electrons is increased from the cathode electrode 1 at temperature equivalent to the work function of the coating material or higher, and thus it is possible to easily elevate the temperature of the anode electrode 2 and increase the energy conversion efficiency. Note that the smaller the work function, thermoelectronic effect can be obtained from the lower temperature to be elevated, to facilitate temperature increasing. However, actually, a material having smaller work function deactivates when it contains outside air or water after it is activated (increasing temperature thereof once), and thus becoming ineffective. In addition, since coating is applied to a side receiving ion bombardment, the material deactivates due to ion bombardment as well, and furthermore, it quickly peels off by ion sputtering. Accordingly, there is a need for experiment to make sure which material is most suitable. However, when the work function of the material of electrode itself is small, its effect can be maintained even if the coating peels off, so that a cleaner state can be maintained by sputtering. By using such materials as the material of electrode itself, the heating device can further exert its effect.

Further, out of the heat-resistant materials of the cathode electrode 1, titanium in particular has poor heat conduction despite superior corrosion resistivity to a reactive gas containing chlorine or fluorine. For this reason, although it is not used as a heater material for a substrate, high-speed temperature increase can be performed and temperature distribution having extremely high uniformity can be obtained according to an embodiment of the present invention. Thus, by using titanium as the heat-resistant material of the cathode electrode 1, it is possible to provide a heating device with superior corrosion resistivity to reactive gas containing chlorine or fluorine and high uniformity of temperature distribution.

It is preferable to use the heat-resistant body which is coated with a dense film having heat resistance on the surface thereof, at least on a surface exposed to outside air, for example, as the anode electrode 2. Any one of graphite, tungsten, molybdenum, Inconel and stainless steel, and any one of a graphite film, SiC film, boron nitride film, aluminum nitride film and alumina film can be used as the heat-resistant body. Thus, the heat resistance of the anode electrode 2 as the heating device can be improved. In addition, since the discharging space can be sealed more completely to outside air, the pressure of the discharging space is stabilized without being affected by pressure variation outside the anode electrode 2.

Further, a material having heat resistance such as BN, alumina ceramic, silicon nitride ceramic or quartz is used as the insulator 4. In this case, there may be a modulation such as thinning the thickness of the anode electrode 2 corresponding to the stem portion of the mushroom shape. With this, heat generated from the anode electrode 2 corresponding to the umbrella portion of the mushroom shape can be prevented from easily conducting to the insulator 4, and thus insulation reduction due to the temperature increase of the insulator can be prevented to improve insulation reliability. Alternatively, the insulator 4 in an outside air side may be cut into fin shapes and cooled.

(ii) Heating Method using the Above-Described Heating Device

Next, the heating device using the heating device will be explained referring to FIG. 1.

In the heating method, at first, pressure is reduced in the space 3 between the electrodes 1, 2, which is surrounded by the anode electrode (second conductive substance) 2 of the heating device and isolated from outside, while gas for electric discharge is introduced thereinto. Then, the pressure in the space 3 between the electrodes 1, 2 is maintained in the range from 10 Pa to 1000 Pa. Note that the pressure in the space 3 between the electrodes 1, 2 may be maintained in the range from 10 Pa to 1000 Pa simply by exhausting the space 3 between the electrodes 1, 2, which was filled with air and under atmospheric pressure, without introducing gas for electric discharge.

Subsequently, direct current or alternating current power is applied between the cathode electrode 1 and the anode electrode 2. This causes electric discharge in the decompressed space 3, followed by maintaining the discharge to increase the temperature of the anode electrode 2. The application of power causes so-called glow discharge of gas for electric discharge to dissociate a part of gas for electric discharge in the space 3 into electrons and ions. Since electrons are small and light, they are accelerated quickly to cause electrolytic dissociation in gas rapidly, followed by forming the discharging space evenly in the entire space through avalanche phenomenon of electrons. When the needle-shaped protrusion is provided in a part of the cathode electrode 1, the field emission occurs more easily.

When direct current power is applied, the electric field generated between the electrodes 1, 2 accelerates the electrons toward the anode electrode 2 to collide the anode electrode 2. On the other hand, ions are accelerated in an opposite direction to electrons toward the cathode electrode 1 to collide the cathode electrode 1. Accordingly, the temperature of the both electrodes 1, 2 increases in the glow discharge. Further, when the temperature exceeds temperature equivalent to the work function of the cathode electrode 1, hot electrons begin to be supplied from the surface of the cathode electrode 1. Since hot electrons contribute to the electrolytic dissociation of gas, heating becomes more easily. In any case, since electrons and ions colliding the electrodes 1, 2 become electric current and the discharging gas (plasma) becomes similar to an electric resistor, temperature obtained is determined by an applied power and can be realized at a range from a few tens ° C. to several thousand ° C.

On the other hand, since positive and negative voltage is alternately applied to the electrodes 1, 2 when alternating current power is applied, electrons and ions collide them alternately. This causes energy conversion from electrons and ions to the electrodes 1, 2 to increase their temperature to high temperature substantially in the same manner.

The anode electrode 2 whose temperature has increased in this manner heats the object subject to heating.

(iii) Heating Inspection using the Above-Described Heating Device

Next, results of various inspections using the heating device will be explained referring to the drawings. As the disc-shaped conductive plate corresponding to the umbrella portion of the mushroom shape of the cathode electrode 1, a conductive disc having a diameter of 250 mm and a thickness of 3 mm with the shape shown in FIG. 3B is used. The diameter of the anode electrode is 280 mm and its thickness is uniform at a top surface, a side surface and a bottom surface, which is 5 mm. Further, isotropic graphite (carbon) is used as the material of both the cathode electrode 1 and the anode electrode 2. The interval between the disc-shaped conductive plate 1a of the cathode electrode 1 and the anode electrode 2 is set to 8 mm in both upward and downward directions. The interval of BN-sandwiching portion between the stem portion of the cathode electrode 1 and the corresponding anode electrode 2 is set to 5 mm.

Figure 6:
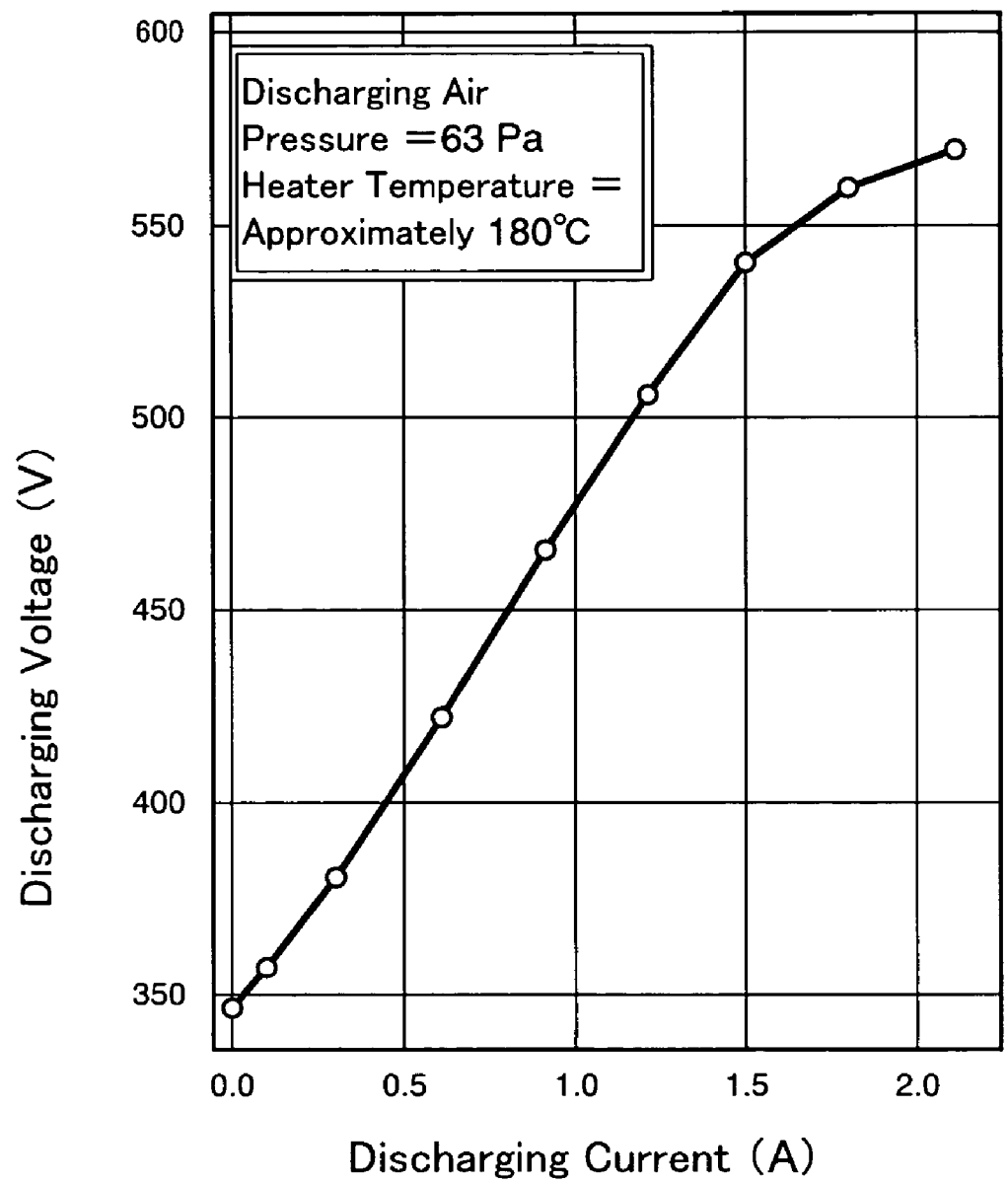
FIG. 6 is a graph (3) showing the result of the heating evaluation conducted by using the heating device according to the first embodiment of the present invention.
Figure 7:
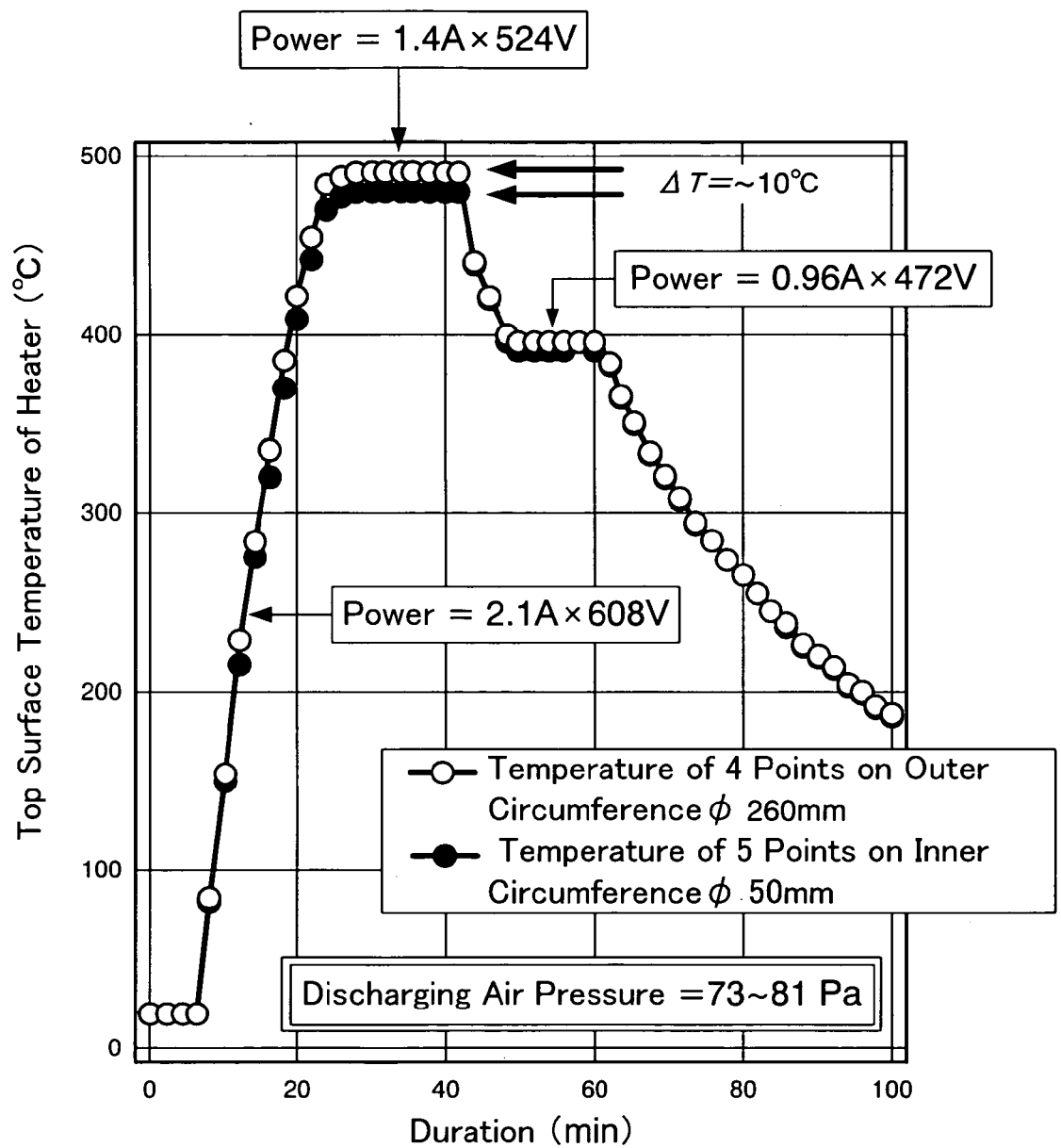
FIG. 7 is a graph (4) showing the result of the heating evaluation conducted by using the heating device according to the first embodiment of the present invention.

Regarding the inspection, air is used as discharging gas, it is performed for the relationship between discharging pressure of air and discharging voltage (FIG. 4), the relationship between discharging pressure of helium and discharging voltage (FIG. 5), the relationship between discharging current and discharging voltage regarding air (FIG. 6), and the up and down characteristic of the temperature of the anode electrode top surface, which is measured immediately after the application of power (FIG. 7).

Note that the experiment for inspection is conducted as follows. That is, the above-described heater of all-carbon structure dimensions (the structural body of FIG. 1) is installed in a decompression chamber made of aluminum (not shown). The pressure around the heater is maintained at 500 Pa as a constant decompressed outside air state. The reason why the pressure is set to the above-described value is to prevent the carbon of the anode electrode as the second electrode from being damaged by external pressure.

Firstly, in order to inspect the relationship between discharging pressure of air and discharging voltage, the space is exhausted while air is introduced into the space, and then the temperature is once increased to predetermined temperature by electric discharge while the discharging pressure is maintained at a substantially constant level. The temperature is 540° C. in FIG. 4, 400° C. in FIG. 5 and 180° C. in FIG. 6. Note that the temperature increase causes the electrode material to emit gas into the space while the discharging pressure is maintained by a balance between the gas emission and exhaust. By the fact, it is considered that gas subject to electric discharge is not only air.

Figure 4:
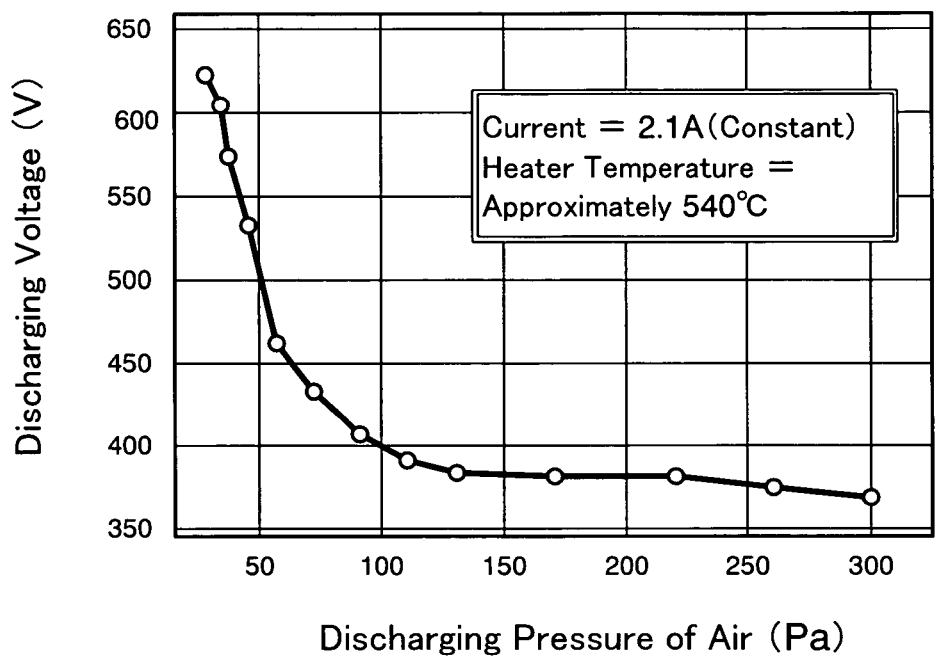
FIG. 4 is a graph (1) showing the result of heating evaluation conducted by using the heating device according to the first embodiment of the present invention.

Inspection is performed for conditions for parameter (gas pressure, gas type, discharging voltage, discharging current) on which electric discharge can be stably maintained at the temperature. Specifically, although power that can be input to the heater of the present invention is given by a product of voltage and current (I×V), the pressure of gas, by which electric discharge can be stably maintained, is limited in a certain range. Such range varies depending on the type of gas and an electrode structure. Then, the higher the starting voltage for electric discharge, the easier electric discharge is caused. Once electric discharge starts, the resistance of discharging gas becomes extremely low. Thus, when the discharging current (I) is maintained at a constant level, input power (I×V) falls to a fraction of the power at the starting time. Cost of the power source prepared for heating by heater is determined by the magnitude of I×V. To suppress the cost, it is advantageous to preferably keep the power source voltage lower to make the current large. In other words, it is advantageous to control heater temperature (input power) by keeping the starting voltage low and adjusting a current magnitude. For this reason, the inspection of the device shown in FIG. 1 is performed preparing a constant voltage and constant current power source having the maximum output voltage of 620 V and the maximum output current of 2.1 A. Specifically, direct current power is applied between the electrodes 1, 2 to generate electric discharge. A state is created such that the maximum current of the power source of 2.1 A can be maintained in a state where the temperature reachs 540° C. In such a state, observation is performed for how a sustaining voltage for stable electric discharge varies when the pressure is varied. The result is shown in FIG. 4. Note that a constant voltage and constant current power source is the above-described one which is available by chance, but even 10 A instead of 2.1 A is acceptable if a power source having higher voltage and current supply capability is available.

The axis of ordinate of FIG. 4 shows the discharging voltage (V) shown in linear scale, and the axis of abscissa of FIG. 4 shows the discharging pressure (Pa) of air shown in linear scale.

As shown in FIG. 4, the sustaining voltage for electric discharge continuously increases as the pressure of gas is gradually reduced, and thus power to be input can be made larger. This is because an average distance until electrons collide gas increases by reduction of an internal pressure and thus electrons are further accelerated along the increased distance. When the pressure reaches about 30 Pa, the voltage reaches the maximum voltage of the power source unit prepared for the inspection and thus input of full power can be allowed. However, electric discharge becomes unstable under this pressure or lower. In this case, it is found that re-start is difficult once electric discharge stopped. On the other hand, electric discharge also become unstable under the pressure of 300 Pa or more. Under the pressure between 100 Pa and 300 Pa, on the contrary, starting of electric discharge is very easy even if the pressure varied a little and it is possible to stably apply current at a voltage between 370V and 380V. As described above, in the heating device of this embodiment, 600V is required for the starting voltage and on the other hand, 400V is sufficient for the sustaining voltage of electric discharge. For example, an small current power source only for starting electric discharge is prepared in addition to a power source for sustaining electric discharge, and a constant current power source having 400V may be prepared as a power source for sustaining electric discharge, which is a main power source. Note that a constant voltage power source is not suitable as the power source of this device because voltage falls down quickly as voltage supply is started by electric discharge.

Figure 5:
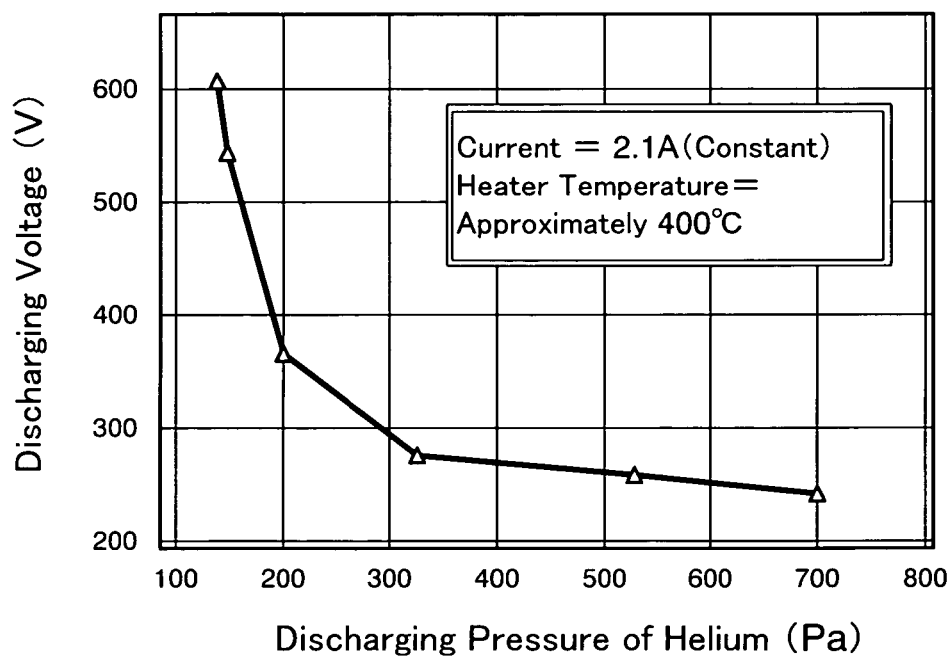
FIG. 5 is a graph (2) showing the result of the heating evaluation conducted by using the heating device according to the first embodiment of the present invention.

Further, the same inspection as described above is conducted using helium gas in which electric discharge is most difficult to occur as gas type for electric discharge. The result is shown in FIG. 5. FIG. 5 is the graph showing the inspection result of the relationship between discharging pressure of helium and discharging voltage using the above-described heating device. The axis of ordinate shows the discharging voltage (V) shown in linear scale, and the axis of abscissa shows the discharging pressure (Pa) of helium shown in linear scale.

In this case, it turns out that it is sufficient for a main constant current power source to be prepared to be even one capable of outputting 300V. On the contrary, stable pressure is as high as 300 Pa to 700 Pa, and thus decompression can be easily performed. However, the discharging voltage in a stable range of pressure is 240V to 280V, which is lower than that of air, and thus it is found out that current needs to be increased to complement the lower voltage in order to input the same power (I×V) as that of air.

Next, air is used as discharging gas and the pressure is maintained at 63 Pa. Inspection is conducted as to how a necessary voltage varies with respect to input current while the pressure is kept as it is. FIG. 6 shows how the voltage is increased when the input current is continuously increased. The axis of ordinate of FIG. 6 shows the discharging voltage (V) shown in linear scale, and the axis of abscissa of FIG. 6 shows the discharging current (A) shown in linear scale.

As shown in FIG. 6, it turns out that, in the device of FIG. 1, current and voltage are substantially in a proportional relationship at a range of 1.5 A or lower and the air can be used as regular resistor. The voltage increase saturates when the discharging current reaches approximately 2 A, and the voltage increase slows down at a range of higher current than 2 A. The voltage value is within the starting voltage (600V). As described above, considerable high heating temperature is obtained by the power source having 600V or less. Since a power source having 600V or more is expensive, it is desirable to use a voltage range within 600V wherever possible. In this case, current may be controlled in order to increase the input power (that is, in order to increase temperature).

Consequently, the input power (temperature) can be controlled simply by controlling current. Specifically, the feedback control of temperature can be performed by the current control of the power source. In either case where the discharging gas is air or helium, since the discharging voltage can be increased when gas pressure is lower, the input power can be made higher. This is obvious from the inspection of FIG. 4 and FIG. 5. However, it is found out that the starting voltage is increased in accordance with the increased power and electric discharge is more likely to stop.

Next, in order to inspect the top surface temperature of the heater as a basic characteristic of the heating device, the discharging space is exhausted while air is introduced into the space to keep the space pressure constantly in the range from 73 Pa to 81 Pa. Then, at first, the discharging voltage of 608 V and the discharging current of 2.1 A are kept, and the temperature-up characteristic is inspected in the state where the maximum power of a prepared power source is input. Then, the discharging current is decreased and then the temperature-down characteristic and the electric discharge sustaining voltage is inspected. Note that although electric discharge is more stable when the pressure is set to 100 Pa to 200 Pa, the pressure is set to the inconvenient value in order to conduct experiment under the condition closer to the maximum capability of the prepared power source unit. Furthermore, air pressure capable of maintaining the discharging voltage of 600V is 30 Pa in FIG. 4, while the pressure is different from the value FIG. 6 and FIG. 7. This is due to instability peculiar to electric discharge. Conversely, this shows that the input power (temperature) can be controlled with good accuracy as long as current control is accurately done even if the pressure has such a wide variation.

The result is shown in FIG. 7. The axis of ordinate and the axis of abscissa of FIG. 7 show the temperature (° C.) of the top surface of the anode electrode 2 shown in linear scale and duration (min.) shown in linear scale, respectively. In the graph, white circles show temperature measured at four points on a circumference 260 mφ around the center of the conductive disc-shaped flat plate shown in FIG. 2. Black circles show temperature measured at five points on a circumference 50 mφ around the center of the conductive disc-shaped flat plate shown in FIG. 2.

Firstly, a power source switch is turned on into 2.1 A to start electric discharge in the state where the heating device is kept at room temperature (20° C.) and the discharging space inside the device is decompressed to approximately 80 Pa. The power source voltage is 608 V. At this point, the temperature-up characteristic of approximately 50° C./min. is obtained in the heating device. Despite that the diameter is as large as 280 mm and the both sides of the electrode 2 is graphite having large radiation ratio (heat emission), it is phenomenal that such a large temperature-up rate is obtained with the input power of 2.1 A×608 V=approximately 1.3 kW.

Next, inspection is sequentially conducted for characteristic mode when the temperature is kept at a constant level in the state where the temperature reachs 490° C. In this inspection where the heating device is installed in a vacuum chamber made of aluminum, necessary current to maintain 480° C. is approximately 1.4 A. At this point, the voltage falls to 524 V, and thus power to maintain the temperature is 1.4 A×524 V=approximately 0.73 kW, so that power saving is achieved comparing to a conventional heater.

Then, when the power source is turned off completely, the temperature of the heating device quickly falls, and the power source switch is turned on again in the state where the temperature falls to 400° C. along the way. Electric discharge starts quickly and necessary power to maintain the 400° C. is 0.96 A×472 V=approximately 0.45 kW. Then, the power source is turned off completely and leaves the state. On and after, further curve in the graph shows how the temperature falls.

In the heating device of the first embodiment, since heating is conducted by the discharging current evenly spreading in the space between the electrode 1 and the electrode 2 as shown in FIG. 7, the temperature variation is only 1° C. to 2° C. (0.2 to 0.4%) at the center on the top surface of the electrode 2 and the central circumference around the center thereon, which are shown in ① to ⑤ in FIG. 2. Further, the temperature variation is also only 1° C. to 2° C. at the four points near right above the outer circumference of the electrode 1 on the top surface of the heater, which are shown in ⑥ to ⑨ in FIG. 2. Thus, extremely uniform temperature distribution is obtained. However, since much heat is emitted outside from the side surface in the outer circumference portion of the top surface, its temperature is a little lower than that of the central portion. Specifically, as it is clear when comparing the white circles with the black circles in FIG. 7, the temperature at the outer circumference on the top surface of the heater is about 10° C. lower than that of the central portion thereon. On the other hand, deviation is as much as 30° C. in the case of FIG. 3A. Therefore, it is confirmed that the temperature of the circumference portion could be increased into uniformity by forming holes on the central portion of the electrode 1 (or fabricating it with wire-mesh). Further, the graph shows that the temperature on the top surface of the electrode 2 tracks up and down of temperature control very well.

As described above, according to the heating device of the embodiment of the present invention, by modifying the shape of the cathode electrode 1, in-plane temperature distribution is suppressed at a few percent or less, the temperature can be increased at the temperature-up rate of 50° C./min., and each point has very good temperature trackability. The temperature of the object subject to heating can be increased to target temperature simply by preparing the power source having the voltage of about 600V and controlling current. For example, when using a power source having about 600V and 10 A, it is possible to increase the temperature of the anode electrode 2 to 1000° C. or higher.

Further, although not shown, in another inspection conducted in addition to this inspection, the temperature can be increased to 1000° C. by inputting power of only 800 V×0.8 A. In the inspection, the cathode electrode 1 (the first conductive substance) is made of a molybdenum thin disc having the diameter of 100 mm, the anode electrode 2 is also made of molybdenum having the diameter of 120 mm and the height of 20 mm (the interval between the electrodes 1, 2 is 4 mm in both upward and downward directions), and helium was used as gas for electric discharge.

As described above, according to the first embodiment of the present invention, the anode electrode 2 provided so as to surround the cathode electrode 1 and exposed to outside air is used as the means for heating the object subject to heating. Thus, the top surface of the anode electrode 2 can be used as the mount surface 2a for the object subject to heating, and thus it is possible to provide the heating device suitable for the single wafer type apparatus for manufacturing semiconductor device.

Further, direct current power is applied between the cathode electrode 1 and the anode electrode 2 to cause glow discharge of gas for electric discharge, and thus electrons dissociated from gas for electric discharge collide with each other to increase the temperature of the anode electrode 2. Furthermore, when the temperature of the cathode electrode 1 exceeds temperature equivalent to the work function of the material thereof, then hot electrons generate from the material itself, and thus the total amount of electrons in the discharging space increases more than the amount of electrons generated only by electrolytic dissociation of gas. This accelerates electrolytic dissociation and increases the discharging current. Therefore, by increasing applied power, the temperature of the first and second conductive substances can be increased easily and efficiently to reachable temperature determined by fusion of material.

Still further, electrons are not generated from metal by heating, but electrons are generated by causing glow discharge of gas for electric discharge or the like in the decompressed space, so that the temperature of the anode electrode 2 can be increased simply by preparing a power source capable of generating voltage so as to cause glow discharge and then controlling discharging current. In addition, energy is directly imparted to the anode electrode 2. Consequently, the heating device has a good thermal conversion efficiency of energy and functions as a resistor in which there is no problem such as breaking of wire and insulation failure, and thus it is possible to attain power saving and smaller size of device.

Moreover, the heating device uses the energy exchange due to the collision of electrons generated by the glow discharge which is caused using gas for electric discharge between the cathode electrode 1 and the anode electrode 2. For this reason, the conductive disc-shaped flat plate 1$a$ of the cathode electrode 1 is provided with the through holes 1$c$ or the like, which are adjusted in the shape and the distribution on the flat plate 1$a$, and thus it is possible to adjust a electric discharging intensity distribution. Further, this makes it possible to adjust the collision distribution of electrons relatively easily, and thus highly uniform temperature distribution is relatively easily obtained. Accordingly, the device can be applied for a large substrate.

Second Embodiment

Figure 8:
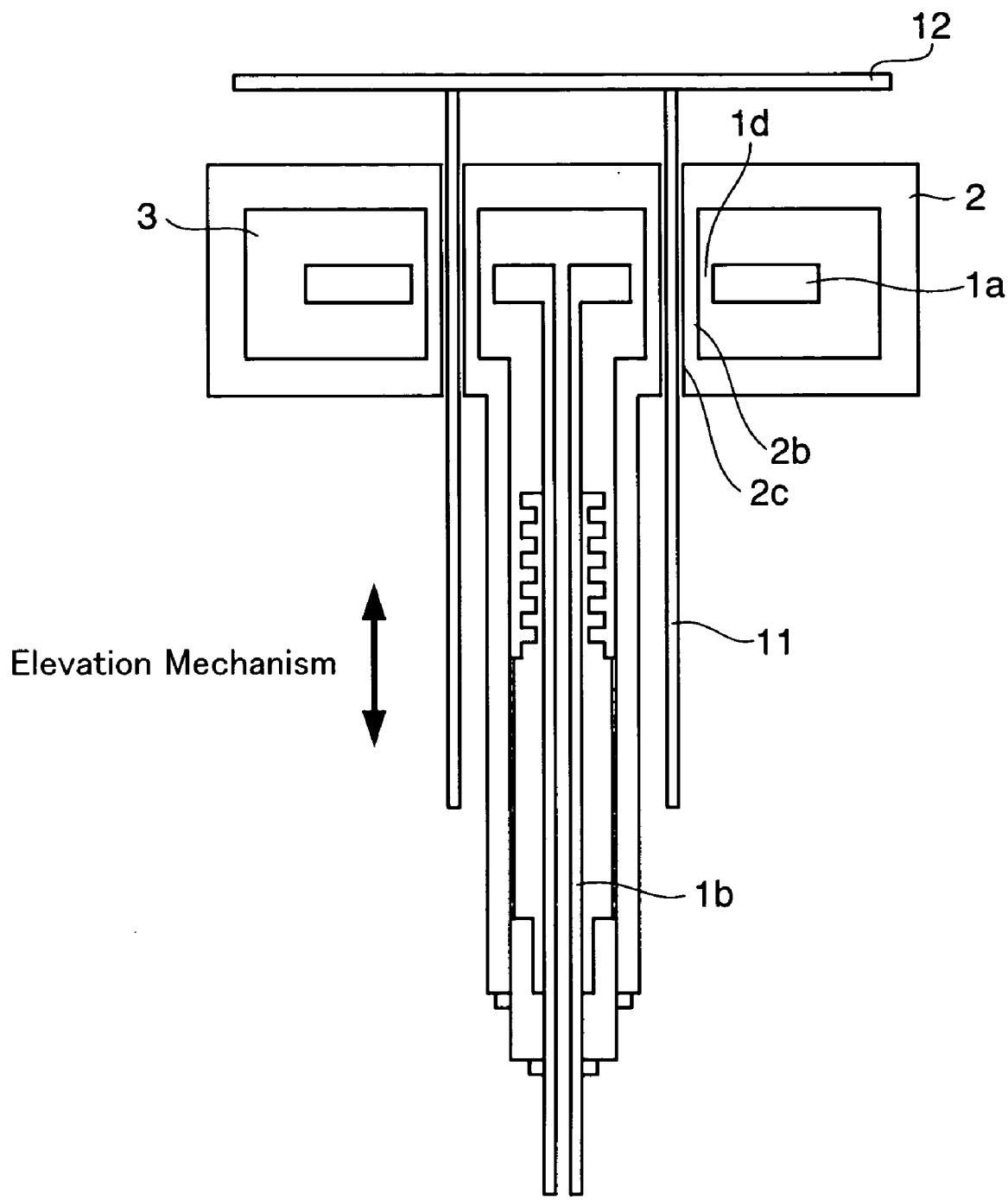
FIG. 8 is a side sectional view showing the entire constitution of the heating device according to a second embodiment of the present invention.

FIG. 8 is the side sectional view showing the constitution of the heating device of the second embodiment of the present invention.

In the heating device of the second embodiment, another constitution is added to the heating device of FIG. 1. For details, as shown in FIG. 8, the disc-shaped conductive plate 1$a$ corresponding to the umbrella portion of the mushroom shape of the cathode electrode 1 is provided with through holes 2$c$, which reaches from the anode electrode 2 below the rear surface of the disc-shaped conductive plate 1$a$ to the anode electrode 2 above the top surface thereof. The sides of the through holes 2$c$ are covered with cylindrical partition wall 2$b$ having the same material as the anode electrode 2, and the cylindrical partition wall 2$b$ keeps the airtightness of the space 3 between the electrodes 1, 2. The through holes 2$c$ are designed so as to be capable of receiving lifting pins 11 which lift the object 12 subject to heating mounted on the top surface of the anode electrode 2.

Further, the above-described cylindrical partition wall 2$b$ is provided through the through holes 1$d$ of the cathode electrode 1. The size of the through holes 1$d$ is determined and the appropriate interval is maintained between the partition wall 2$b$ of the through holes 2$c$ and the cathode electrode 1 in order to prevent abnormal electric discharge from occurring between the cylindrical partition wall 2$b$ of the through holes 2$c$ and the cathode electrode 1 around the partition wall 2$b$.

As described above, according to the second embodiment, the lifting pins 11 are inserted in the through holes 2$c$ and thus the lifting pins 11 are pushed up when necessary to easily remove the object 12 such as a wafer fixed by vacuum chuck or electro-static chuck on the mount surface 2$a$ on the anode electrode 2 from the mount surface 2$a$.

Further, the partition wall 2$b$ of the through holes 2$c$ functions as a support for the anode electrodes 2 above and below the cathode electrode 1 as well. In the case where the object 12 is used under high-pressure of atmospheric pressure or a heater for heating an object such as a square-shaped large liquid crystal substrate with a side having 1 meter or more is used, the wall prevents formation of crater at a heater center (approximately 1 atmosphere of pressure is applied per 1 square centimeters under atmospheric pressure), and the strength of the anode electrode 2 is improved, where dual effects per single structural element are expected.

Third Embodiment

Figure 9:
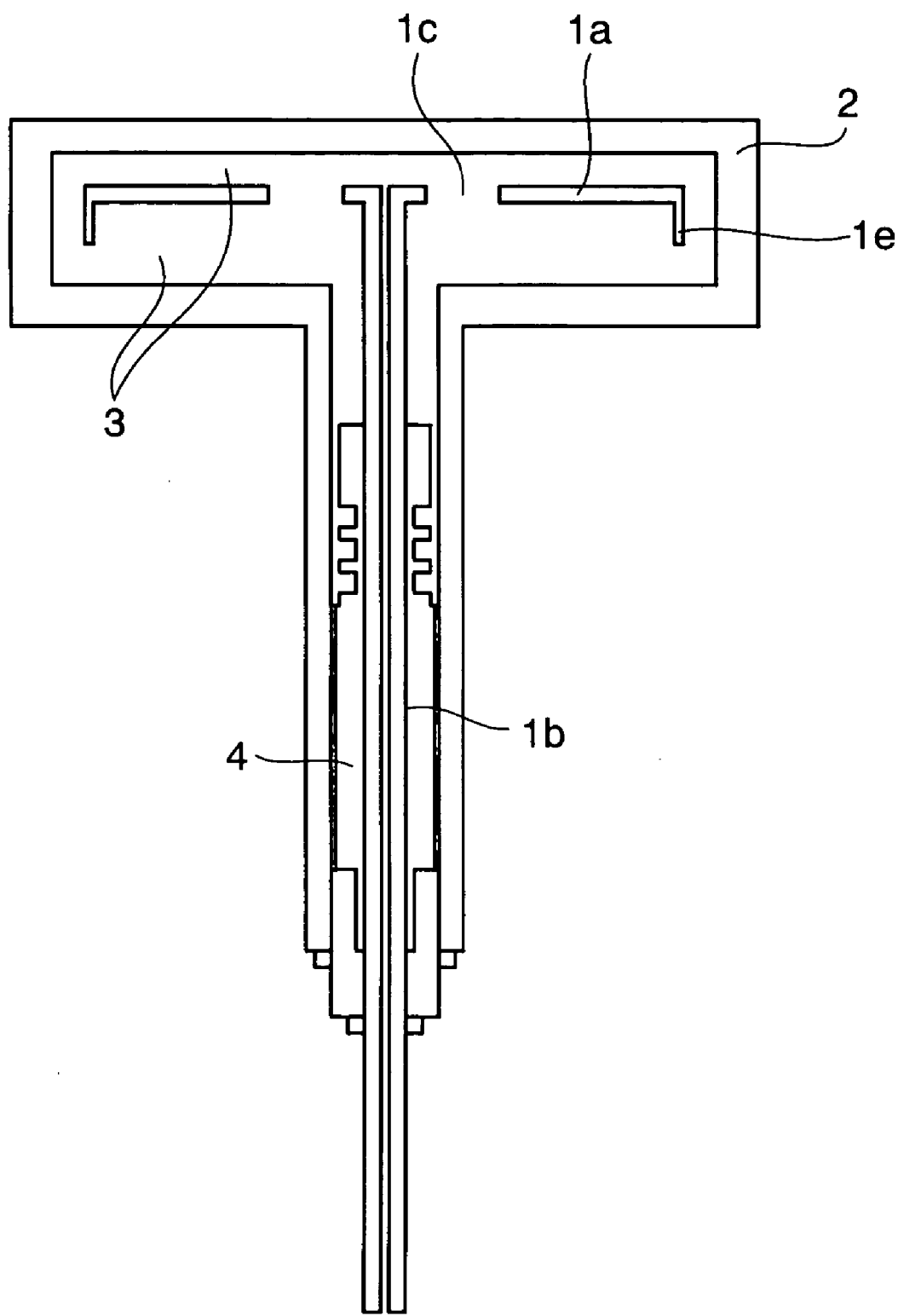
FIG. 9 is a side sectional view showing the entire constitution of the heating device according to a third embodiment of the present invention.

FIG. 9 is the side sectional view showing the constitution of the heating device of the third embodiment of the present invention.

In the heating device of the third embodiment, another constitution is added to the heating device of FIG. 1. For details, as shown in FIG. 9, a plate-shaped conductive substance 1$e$ that becomes a part of the cathode electrode 1 is provided on the circumference portion of the disc-shaped conductive plate 1$a$ corresponding to the umbrella portion of the mushroom shape of the cathode electrode 1, along the sidewall of the anode electrode 2 and so as to be opposed to the sidewall of the anode electrode 2 keeping appropriate interval.

This constitution is effective in making the in-plane temperature distribution further uniform. Specifically, the surface area of the side of the electrode 1 is increased to strengthen the discharge intensity and to compensate for heat lost by the emission from the side of heater periphery, and moreover, the discharge intensity distribution is adjusted by pattern combination of the holes 1$c$ to make the in-plane temperature distribution more uniform.

With this constitution, in addition to the same effect as the case of the first embodiment, the side of the anode electrode 2 of FIG. 1 can be increased to high temperature, so that there is no need for a reflector. The reasons are as follows. A general flat-plate type heater has a structure such that a resistive heating element is at the center and metal or ceramic sandwiches or wraps its upper and lower portions. Thus, a heat-generation surface transmits heat generated from a pyrogen element having the highest temperature to outermost surface either by radiation, thermal conduction or emission via substance that wraps the element. Since the heat from the heater is emitted from the entire surface, the entire surface serves as cooling surface for the heater, as well. As a method of preventing cooling, it is necessary for a conventional heater to suppress heat radiation by a reflector where 5 to 20 pieces of doughnut-shaped thin plates made of molybdenum of low radiation rate or the like are stacked on the rear surface. Accordingly, a heater structure is complex, and high-speed up and down of temperature is difficult due to large heat capacity of the reflector.

On the other hand, since the entire surface. (top surface, side, bottom surface) of the heater of the present invention serves as the heat-generation source (although heat conduction is mainly dominant within the thickness of plate), heat quantity conducting from the top surface to the bottom surface via the side is small. In other words, temperature of heater periphery is hard to fall. This makes it possible to minimize a dummy heater section (low temperature section) and the reflector is unnecessary. Consequently, high-speed up and down of temperature is easy, heat consumed by the reflector is saved, and thus power saving can be achieved.

Fourth Embodiment

Figure 10:
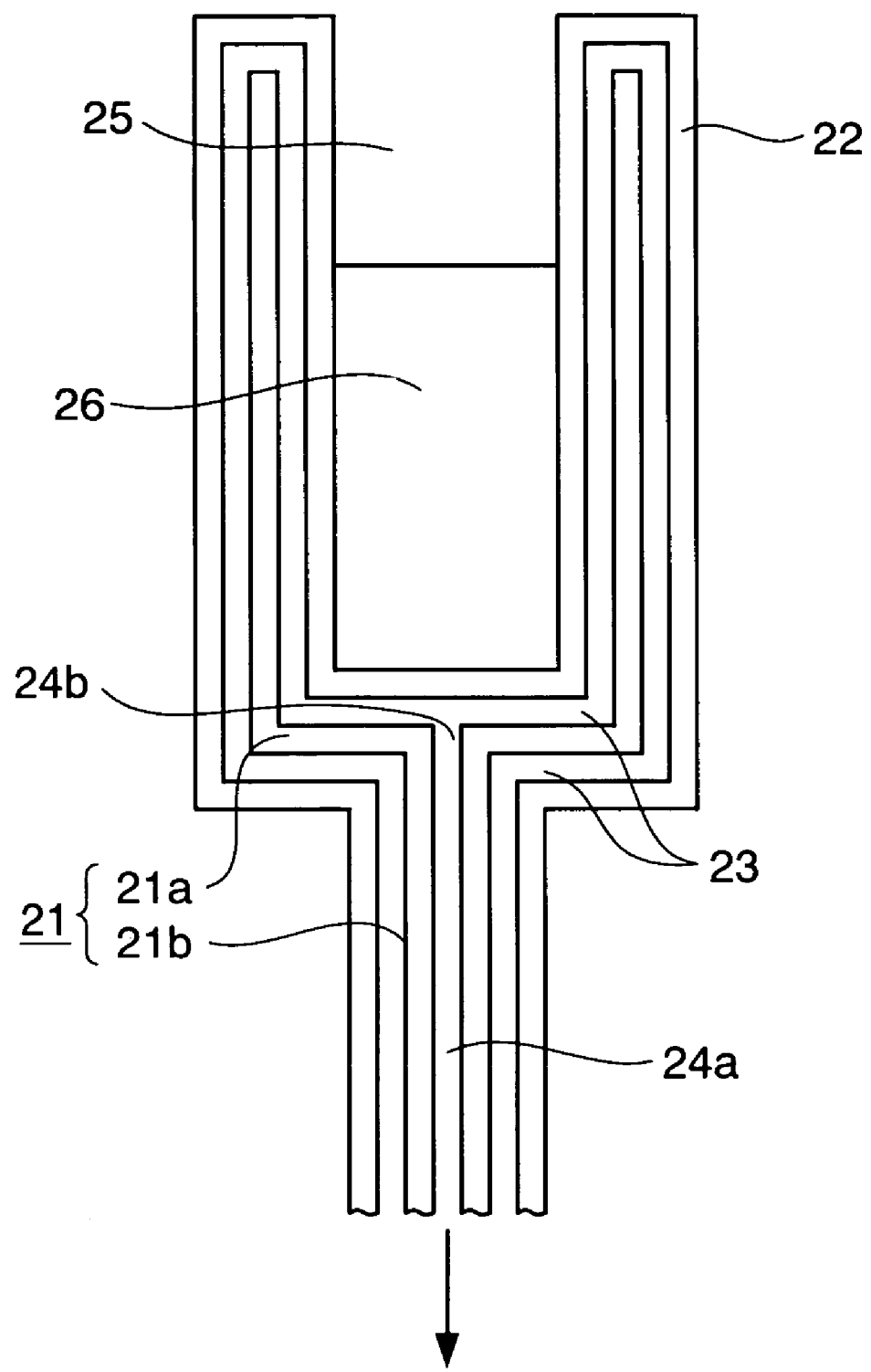
FIG. 10 is a side sectional view showing the entire constitution of the heating device according to a fourth embodiment of the present invention.

FIG. 10 is the side sectional view showing the constitution of the heating device of the fourth embodiment of the present invention.

The heating device according to this embodiment, as shown in FIG. 10, is the same as the heating device of the first embodiment on the point that an anode electrode (second conductive substance) 22 is provided so as to surround a cathode electrode (first conductive substance) 21, but it is different from the heating device of the first embodiment in shapes of the electrodes 21, 22.

Specifically, the cathode electrode 21 has a concave vessel-shaped conductive substance 21a open upward and a column-shaped conductive rod (post-shaped conductive substance) 21b connected to the bottom rear surface of the vessel-shaped conductive substance 21a, and the anode electrode 22 has a shape similar to the cathode electrode 21. The concave portion 25 of the anode electrode 22, which corresponds to the concave portion of the vessel-shaped conductive substance 21a of the cathode electrode 21, is a receiving portion for an object 26 subject to heating.

Regarding the other constitution, an exhaust pipe 24a is provided through the central portion of the column-shaped conductive rod 21b of the cathode electrode 21. The exhaust pipe 24a, at one end, is open through a hole 24b formed in the vessel-shaped conductive substance 21a to a space 23 between the electrodes 21, 22 at the bottom of the concave portion of the cathode electrode 21. And it, at another end, is connected to an exhaust port connecting to the exhaust means. Note that although FIG. 10 does not show the lower portion of the column-shaped conductive rod 21b in the cathode electrode 21 of the heating device, it is in the same constitution as the lower portion of the column-shaped conductive rod 1b in the cathode electrode 1 of the heating device as shown in FIG. 1.

Although not shown in FIG. 10, at least one or more through holes for adjusting discharge distribution are provided for the vessel-shaped conductive substance 21a of the cathode electrode 21 in the same manner as the first embodiment.

Since the heating means of the heating device of this embodiment has the vessel shape, it is suitable for a case where the object 26 subject to heating is contained in the concave portion 25 of the anode electrode 22 to heat the object 26 into fusion.

Furthermore, since the heating device of this embodiment has the same structure as the heating device of the first embodiment except for the electrodes 21, 22, the same operation and advantages as those of the heating device of the first embodiment can be obtained.

Fifth Embodiment

Figure 11:
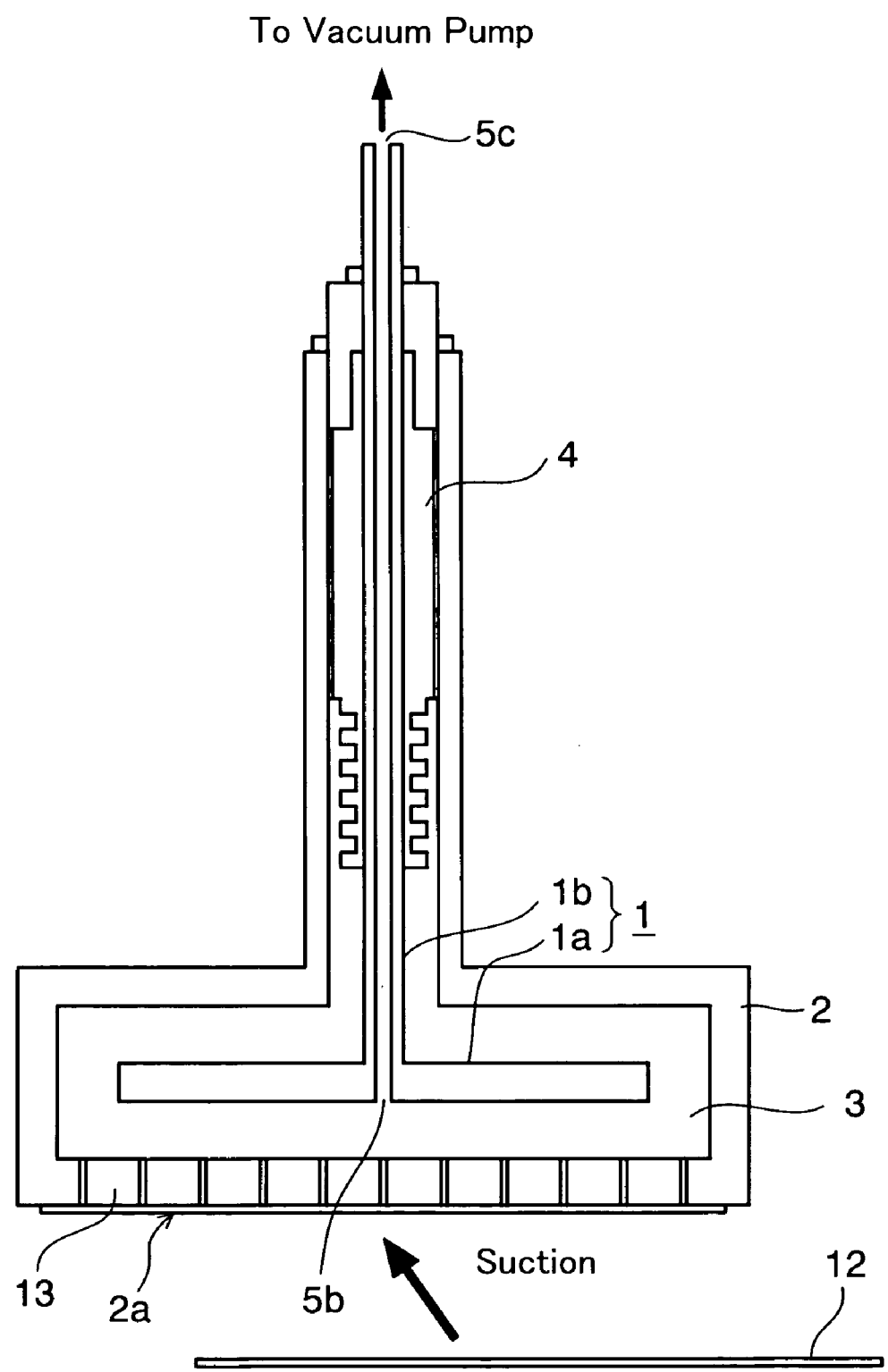
FIG. 11 is a side sectional view showing the entire constitution of the heating device according to a fifth embodiment of the present invention.

FIG. 11 is the side sectional view showing the constitution of the heating device of the fifth embodiment of the present invention.

Most heaters provided for single wafer type processing apparatuses in a semiconductor industry are installed such that the substrate mount surface of the heaters faces upward, and wafers are directly placed on the substrate mount surface contacting their rear surface in most cases. Therefore, there is a possibility that reactive product is adhered to the inner wall or the like of a reaction chamber, and then peels off during temperature increasing and decreasing to drop on the surface of wafer. Thus it results in lowering of yield. The heating device according to the fifth embodiment of the present invention is effective in solving the problem.

The heating device, as shown in FIG. 11, has a similar structure to that of FIG. 1, but it has a large number of through holes (suction holes) 13 reaching the inside discharging space 3, on the substrate mount surface 2a of the anode electrode 2, unlike the heating device of FIG. 1. In addition, the heating device is installed upside down such that the substrate mount surface 2a of the anode electrode 2 faces downward. Note that the other reference numerals of FIG. 11 shown in the same reference numerals of FIG. 1 denote the same items in FIG. 1.

Note that the above-described heating device has a large number of through holes (suction holes) 13 reaching the inside discharging space 3, on the substrate mount surface 2a of the anode electrode 2, but a portion corresponding to the substrate mount surface 2a of the anode electrode 2 may be formed by a porous sintered body. A metal material or a nonmetal material can be used as the porous sintered body. Sintered metal of tungsten or molybdenum is used as the metal material, and it is welded to a portion corresponding the substrate mount surface of the anode electrode 2, which is formed by the same material, by electron beam welding or the like. Further, a porous graphite material is used as the nonmetal material, and it is adhered to a portion corresponding to the substrate mount surface of the anode electrode 2 by graphite adhesive agent (phenol) and is sintered. In this case, as a material of the anode electrode 2, there is used a graphite material whose surface is coated by carbon film or a graphite material having high sealing performance such as vitreous coated carbon in which porous graphite is impregnated with phenol and sintered. Particularly, since the latter case is a complete nonmetal constitution and the wafer can be attached downward maintaining complete adhesion, it is possible to provide an ideal heater having no metal contamination at all. Further, when a large number of through holes are formed on the substrate mount surface, there is a possibility that a part of electrons generated by electric discharge passes the through holes to collide the wafer, and causes damage to the wafer. However, since electrons do not pass to the wafer when using the porous conductive substance, such damage does not occur.

Next, the operation of the heating device will be explained by using the heating device of this embodiment provided for a CVD apparatus.

Firstly, the discharging space 3 inside the heating device installed in the reaction chamber is exhausted and decompressed, and the wafer (substrate) 12 is moved closer to the substrate mount surface 2a simultaneously. The wafer 12 is sucked by the suction holes 13 and then fixed to the substrate mount surface 2a by pressure difference. Since the suction holes 13 are closed by placing the wafer 12, the degree of vacuum in the discharging space 3 goes higher rapidly. In other words, the pressure goes lower. Subsequently, the inside of the reaction chamber is exhausted while carrier gas (hydrogen, argon, nitrogen, or the like) is introduced into the reaction chamber to maintain the constant pressure (a few hundred Pa to 1000 Pa, normally). Reactant is not supplied yet. In conjunction with this, conductance of a vacuum pump connected to the discharging space 3 of the heating device is adjusted into the most suitable pressure for electric discharge. In this case, the conductance of the vacuum pump is adjusted taking the carrier gas leaked into the space 3 from a chink between the suction holes 13 and the wafer 12 into consideration as well. The pressure is different depending on a type of gas, and it is maintained at 30 Pa to 300 Pa similarly in the case of nitrogen.

Subsequently, direct current power, for example, is applied to the electrodes 1, 2 to cause electric discharge and it is maintained so that the temperature of the heating device is increased. As described, the wafer 12 can be heated in the state where the wafer 12 is sucked and fixed on the mount surface. When the temperature reaches target temperature, the reactant is mixed into the carrier gas to form a film on the wafer.

It is possible to deposit a CVD film on the wafer 12 heated to predetermined temperature in this manner.

Note that, when annealing treatment is performed instead of deposition, the wafer 12 is mounted on the heating device, appropriate inert gas is introduced into the chamber in the range from a few hundred Pa to the atmospheric pressure, and the wafer 12 is sucked and fixed on the mount surface. Then, the conductance of the vacuum pump connected to the heating device is adjusted taking the inert gas leaked from a chink between the suction holes 13 and the wafer 12 into consideration, and the discharging space is set to the most suitable pressure for electric discharge. Next, electric discharge is caused in the discharging space and is maintained to heat the wafer 12.

As described above, according to the heating device of the fifth embodiment of the present invention, heat loss is small and the uniformity of the in-plane temperature distribution of the wafer 12 is good because the contact of the wafer 12 to the substrate mount surface 2a is very good. Thus, it is possible to provide a heating device where the temperature of the substrate mount surface 2a matches the temperature of the wafer 12 well.

Note that it goes without saying that this heating device can be applied for the case where the heating device is installed such that the substrate mount surface 2a of the heating device faces upward.

For example, when the heating device is installed such that the substrate mount surface 2a of the heating device faces upward, the tight contact between the wafer 12 and the substrate mount surface 2a is not secured if the devices is not provided with the vacuum chuck, and thus there is a possibility that the temperature of the wafer 12 falls down at the periphery thereof even if the in-plane temperature distribution of the heating device is uniform. To improve this, the in-plane temperature distribution of the heating device needs to be non-uniform on purpose.

On the other hand, there exists the electro-static chuck other than the above-described vacuum chuck as mechanism for improving the contact, but the electro-static chuck has a very low temperature-up limit of 300° C.

On the contrary, the heating device according to this embodiment is capable of heating the substrate to 1000° C. or higher, and securing superior contact so that the heat loss is small and the uniformity of the in-plane temperature distribution is good. Therefore, the heating device according to this embodiment is useful even if it is applied for the heating device which is installed so that the substrate mount surface 2a of the heating device faces upward.

Sixth and Seventh Embodiments

FIG. 12 is the side sectional view showing the constitution of the heating device of the sixth embodiment of the present invention.

The heating device of the sixth embodiment is constituted of a first electrode (first conductive substance) 31 formed of a conductive disc-shaped flat plate, a second electrode (second conductive substance) 32 formed of the conductive disc-shaped flat plate, which opposes to the first electrode 31 with an appropriate interval, and an insulator 33 formed on the periphery of a space 34 between the first electrode 31 and the second electrode 32. The space 34 isolated from outside air is formed in an inside area surrounded by the first electrode 31, the second electrode 32 and the insulator 33, and the space 34 is previously decompressed. The decompressed space 34 is fabricated as follows. That is, a structural body prior to isolating the space from outside air is inserted into another decompression vacuum unit before assembly. Then decompression is performed in atmosphere of at least one of helium, neon, argon, krypton, xenon, nitrogen, hydrogen, carbon dioxide and air. After predetermined pressure is obtained, the space of the structural body is enclosed. Alternatively, gas absorber may be previously inserted into a part of the space 34 prior to isolating from outside air. In this case, after the space is enclosed, gas is emitted from the gas absorber or gas is absorbed by gas absorber to maintain the suitable pressure for electric discharge.

Moreover, unlike the first embodiment, each one surface of the both first and second electrodes 31, 32 is exposed to outside air, and the both or one of the first and second electrodes 31, 32 can be used as the heating means. In this case, the external surface of the both or one of the first and second electrodes 31, 32 can be used as a mount section 35 for the object subject to heating.

Regarding one of the first electrode 31 and second electrode 32, which is used as the cathode electrode, it is made itself of material having a small work function of electron emission. Or it is coated with the material having a small work function of electron emission on the surface of the high melting material, which is at least exposed to the space. On the other hand, regarding another one used as the anode electrode, it is coated with a graphite film or an SiC film on the surface of graphite, which is at least exposed to outside air. In the case of applying alternating current power the above-described materials are selected appropriately as the material of the first electrode 31 and the second electrode 32. Further, boron nitride (BN), alumina or quartz is used as the material of the insulator 33.

Next, the heating method using the above-described heating device will be explained.

Firstly, with respect to a power supply unit having electrode terminals which are connected to the power supply source, the heating device is set to the power supply unit, such that the respective first electrode 31 and the second electrode 32 of the heating device contact the corresponding electrode terminals.

Then, power capable of maintaining electric discharge is applied between the first electrode 31 and the second electrode 32 of the heating device. Either direct current power or alternating current power may be used as the applied power. In the case of employing direct current power, it is acceptable that positive and negative output terminals of the power supply source are connected to the first electrode 31 and the second electrode 32, respectively or inversely. Thus, electric discharge is caused in gas in the decompressed space 34, and the discharge is maintained to increase the temperature of the first electrode 31 and the second electrode 32.

In the case of applying direct current power, the energy conversion by electrons and ions dissociated by electric discharge increases the temperature of the electrodes 31, 32. Meanwhile, in the case of applying alternating current power, positive and negative voltage is applied alternately to the first electrode 31 and the second electrode 32, so that the temperature of the first electrode 31 and the second electrode 32 increases in the same manner on receiving the collision of electrons and ions.

The object subject to heating is heated by at least one of the first electrode 31 and the second electrode 32, whose temperature increases.

According to the above-described heating device of the sixth embodiment, simply by setting the heating device to the power supply unit to allow the power supply source to supply power, heating can be performed at least by one of the first electrode 31 and the second electrode 32. Therefore, the device is suitable for a portable simple heating device generating approximately 400° C. to 500° C.

In addition, according to the heating device of the sixth embodiment, by generating electric discharge of gas in the space 34 and maintaining the discharge in the same manner as the first embodiment, the temperature of at least one of the first electrode 31 and the second electrode 32 is increased. Consequently, the device exerts the same operation and advantages as the first embodiment.

Figure 13:
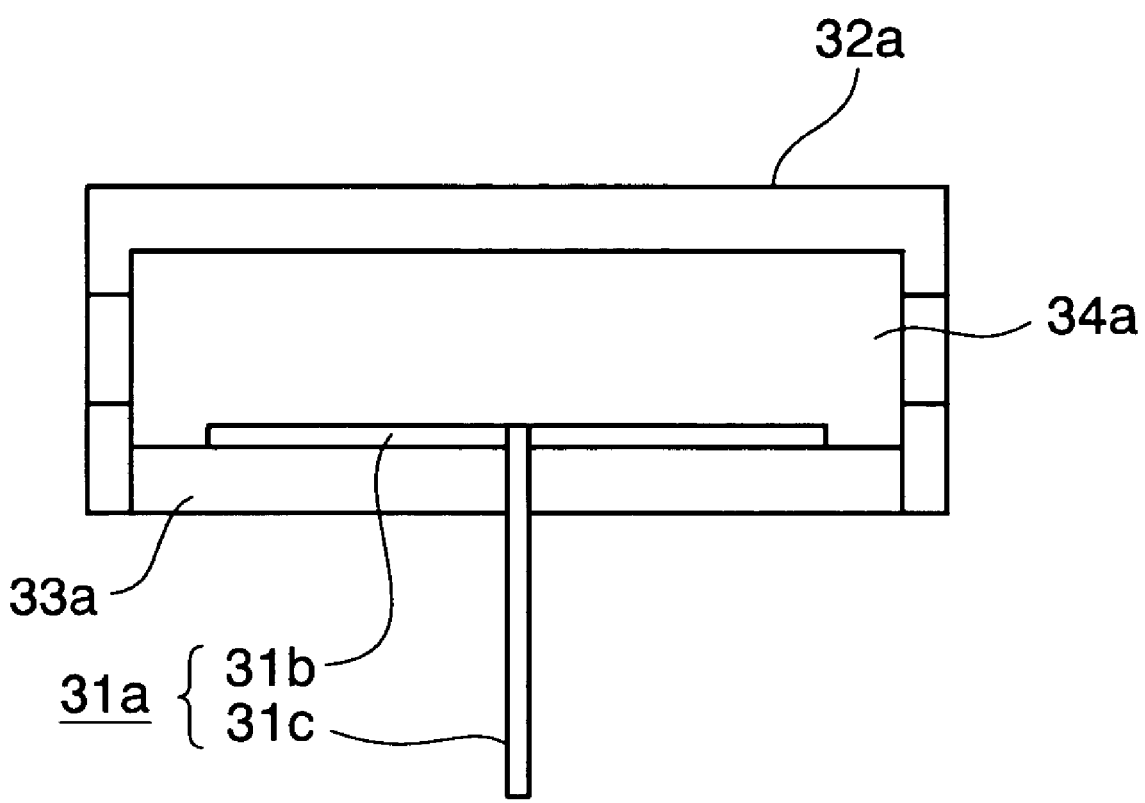
FIG. 13 is a side sectional view showing the entire constitution of the heating device according to a seventh embodiment of the present invention.

Note that the structure as shown in FIG. 13 is possible instead of the constitution of the heating device of FIG. 12. FIG. 13 is the side sectional view showing the constitution of the heating device of the seventh embodiment of the present invention.

The heating device of the embodiment is provided with an upper electrode (first conductive substance) 32*a* extending to a lower side (inverse concave shape) and a plate-shaped insulator 33*a* having a width bridging the both lower sides of the upper electrode 32*a* as shown in FIG. 13, instead of the constitution of the box-shaped heating device having flat plate-shaped upper and lower electrodes 31, 32 as shown in FIG. 12. A space 34*a* formed by the upper electrode 32*a* and the insulator 33*a* is a space isolated from outside air. A lower electrode (second conductive substance) 31*a* is placed on the insulator 33*a* inside the space 34*a* to keep it from contacting the upper electrode 32*a*. The lower electrode 31*a* may contact or may be apart from the insulator 33*a*. Furthermore, a rod-shaped electrode 31*c*, which is a part of the lower electrode 31*a*, is led out from the rear surface of the flat-shaped electrode 31*b* via a cut-off portion of the insulator 33*a* so as to isolate the space from the outside air.

Since the seventh embodiment has substantially the same constitution as the sixth embodiment, it exerts the same operation and advantages as the sixth embodiment.

Eighth Embodiment

FIG. 14 is the side sectional view showing the constitution of the heating device of the eighth embodiment of the present invention.

The heating device of the eighth embodiment has a cathode electrode (first conductive substance) 41 formed of a conductive disc-shaped flat plate 41*a* and a column-shaped conductive rod 41 connected to the rear surface of the conductive disc-shaped flat plate 41*a*, and an anode electrode (second conductive substance) 42 provided so as to surround the cathode electrode 41. The anode electrode 42 is provided so as to be opposed to the cathode electrode 41 with an appropriate interval. Further, to connect the power supply source to the cathode electrode 41 from outside, a part of the anode electrode 42 is cut off, and an end portion of the column-shaped conductive rod 41*b* is led out from the cut-off portion via an insulator 43 made of boron nitride (BN). An inside surrounded by the anode electrode 42 and the insulator 43 at the cut-off portion of the anode electrode 42 forms a space 44 isolated from outside air, and the space 44 is decompressed in the similar manner as the sixth embodiment.

In the heating device of this embodiment, the anode electrode 42 is used as the heating means and the top surface of the anode electrode 42 is a mount surface 45 for the object subject to heating.

Note that when the space is previously decompressed and exhaust cannot be performed, gas is implanted into the cathode electrode 41 by electric discharge or adheres to another area (this does not occur in inert gas), and the amount of gas is gradually reduced. Specifically, pressure goes off from a pressure range required for electric discharge. Inert gas should be used to avoid it. Additionally, even if inert gas is used as gas for electric discharge, there is a possibility that gas (such as hydrogen, carbon monoxide and carbon dioxide, possibly) is generated from an electrode material or the like to increase pressure when temperature rises, and the pressure goes off from the most suitable pressure range for electric discharge. To avoid it, barium metal or non-evaporative getter (adsorption material) that adsorbs gas other than discharge gas (inert gas) may be enclosed in a small space where temperature does not rise. Such small space may be individually provided near the insulator 43, for example.

To heat the object subject to heating by the heating device of this embodiment, the heating device is set to the power supply unit having electrode terminals which are connected to the power supply source. The cathode electrode 41 and the anode electrode 42 of the heating device contact the corresponding electrode terminals, in the same manner as the sixth embodiment.

Subsequently, similar to the first embodiment, direct current or alternating current power capable of maintaining electric discharge is applied between the cathode electrode 41 and the anode electrode 42. When applying direct current power, the potential of the anode electrode 42 is set higher than that of the cathode electrode 41. Then, electric discharge is generated in the decompressed space 44 and the discharge is maintained to elevate the temperature of the anode electrode 42. Thus, the object on the anode electrode 42 can be heated.

In the heating device of the eighth embodiment, simply by setting the heating device to the power supply unit to allow the power supply source to supply power, heating can be performed at least by one of the cathode electrode 41 and the anode electrode 42, similar to the case of the sixth embodiment. Therefore, the device is particularly suitable for a portable simple heating device.

In addition, the temperature of the anode electrode 42 is increased by generating electric discharge of gas in the decompressed space and maintaining the discharge, in the same manner as the first embodiment except that this heating device does not have the exhaust port and the gas supply port. Therefore the device has the same operation and advantages as the first embodiment.

Ninth Embodiment

Figure 15:
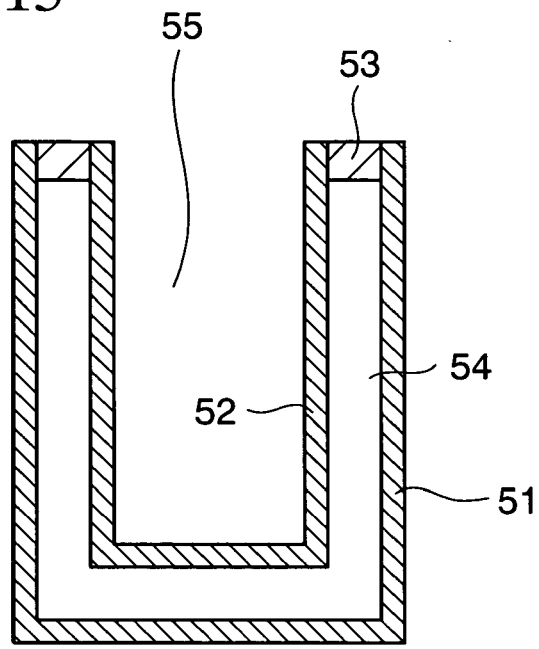
FIG. 15 is a side sectional view showing the entire constitution of the heating device according to a ninth embodiment of the present invention.

FIG. 15 is the side sectional view showing the constitution of the heating device of the ninth embodiment of the present invention.

The heating device of this embodiment is the same as the heating device of the sixth embodiment on the point that respective one sides of a first electrode (first conductive substance) 51 and a second electrode (second conductive substance) 52 are exposed to outside air, as shown in FIG. 15, but has different shapes of the electrodes 51, 52 from those of the heating device of the sixth embodiment.

Specifically, both the first electrode (first conductive substance) 51 and the second electrode (second conductive substance) 52 are formed of concave vessel-shaped conductive substances open upward. An insulator 53 made of boron nitride (BN), alumina, quartz or high-temperature glass is formed in a space 54 between the first electrode 51 and the second electrode 52, which is located at the side periphery of an opening end of a concave portion 55 of the second electrode 52. The inside surrounded by the first electrode 51, the second electrode 52 and the insulator 53 is the space 54 isolated from outside air, and the space 54 is in a decompressed state similar to the sixth embodiment.

In the heating device of this embodiment, the second electrode 52 is used as the heating means, and the concave portion 55 of the second electrode serves as the receiving portion for the object subject to heating.

To heat the object by the heating device of this embodiment, the heating device is set to the power supply unit having electrode terminals which are connected to the power supply source. The respective first and second electrodes 51, 52 of the heating device contact the corresponding electrode terminals. Either direct current power or alternating current power may be used as power to be applied to the heating device. When applying direct current power, the heating device is set such that positive voltage is applied to the second electrode 52 particularly to increase the second electrode 52 to higher temperature because the object subject to heating is contained in the concave portion 55 of the second electrode 52.

Subsequently, similar to the sixth embodiment, direct current power or alternating current power is applied between the first electrode 51 and the second electrode 52 to generate electric discharge in the decompressed space, and the discharge is maintained to increase the temperature of the second electrode 52. Thus, the object in the concave portion 55 of the second electrode 52 can be heated.

In the heating device of the ninth embodiment, simply by setting the heating device to the power supply unit to allow the power supply source to supply power, in the same manner as the sixth embodiment, heating can be performed by the second electrode 52. Therefore, the device is suitable for a portable simple heating device particularly for heating liquid or fusing solid material. Note that an insulating film can be formed on the surface of the electrode 51 to prevent electric shock.

Furthermore, since the heating device of the ninth embodiment has the same structure as the sixth embodiment except for the shapes of the electrodes 51, 52, the same operation and advantages as those of the heating device of the sixth embodiment can be obtained.

Tenth Embodiment

Figure 16:
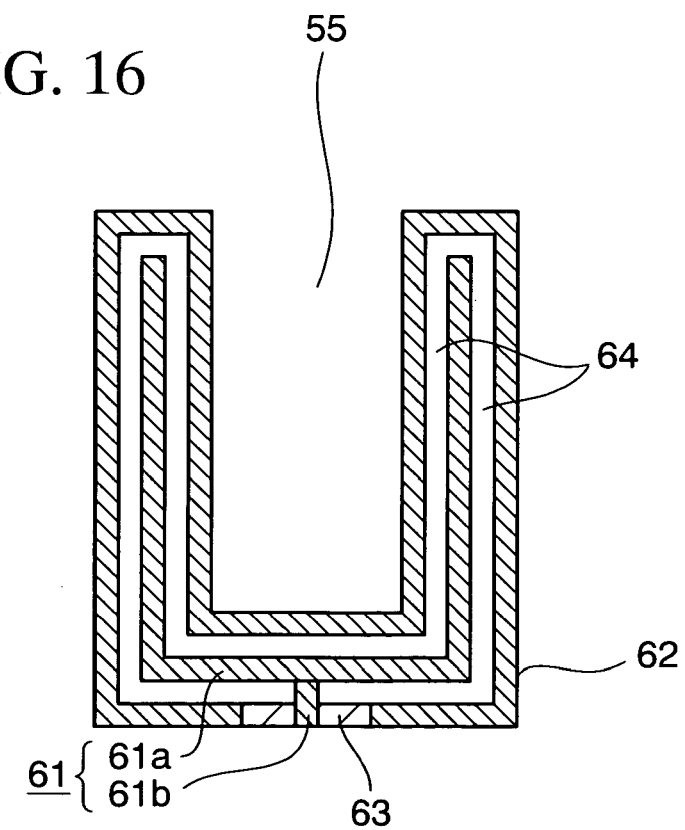
FIG. 16 is a side sectional view showing the entire constitution of the heating device according to a tenth embodiment of the present invention.

FIG. 16 is the side sectional view showing the constitution of the heating device of the tenth embodiment of the present invention.

The heating device of this embodiment, as shown in FIG. 16, is the same as the heating device of the sixth embodiment on the point that an anode electrode (second conductive substance) 62 is provided so as to surround a cathode electrode (first conductive substance) 61, but has different shapes of the electrodes 61, 62 from the heating device of the sixth embodiment.

Specifically, the cathode electrode 61 has a concave vessel-shaped conductive substance 61a open upward and a column-shaped conductive rod (post-shaped conductive substance) 61b connected to a bottom rear surface of the vessel-shaped conductive substance 61a, and the anode electrode 62 has a shape similar to the cathode electrode 61. The concave portion 65 of the anode electrode 62, which corresponds to the concave portion of the vessel-shaped conductive substance 61a of the cathode electrode 61, is a receiving portion for the object subject to heating.

Further, to connect the power supply source to the cathode electrode 61 from outside, a part of the anode electrode 62 is cut off, and an end portion of the column-shaped conductive rod 61b is led out from the cut-off portion via an insulator 63 made of boron nitride (BN), alumina, quartz or high heat-resistant glass. An inside surrounded by the anode electrode 62 and the insulator 63 at the cut-off portion of the anode electrode 62 forms a space 64 isolated from outside air, and the space 64 is in a decompressed state similar to the fifth embodiment.

In the heating device of this embodiment, the anode electrode 62 is used as the heating means, and the object is held in the concave portion 65 of the anode electrode 62.

To heat the object subject to heating by the heating device of this embodiment, the heating device is set to the power supply unit having electrode terminals which are connected to the power supply source. The respective cathode electrode 61 and the anode electrode 62 of the heating device contact the corresponding electrode terminals.

Then, either direct current power or alternating current power capable of maintaining electric discharge is applied between the cathode electrode 61 and the anode electrode 62. When applying direct current power, the potential of the anode electrode 62 is made higher than that of the cathode electrode 61. Thus, electric discharge is generated in the decompressed space, and the discharge is maintained to increase the temperature of the anode electrode 62. Consequently, the object in the concave portion 65 of the anode electrode 62 can be heated.

In the heating device of the tenth embodiment as well, simply by setting the heating device to the power supply unit to allow the power supply source to supply power, in the same manner as the fifth embodiment, heating can be performed by the anode electrode 62. Therefore, the device is suitable for a portable simple heating device particularly for heating liquid or fusing solid material.

In addition, the temperature of the anode electrode 62 is increased by causing electric discharge of gas in the decompressed space 64 and maintaining the discharge, similar to the fourth embodiment except that the heating device of the tenth embodiment does not have the exhaust port and the gas supply port. Therefore, the heating device has the same operation and advantages as the fourth embodiment.

Eleventh Embodiment

Figure 17A:
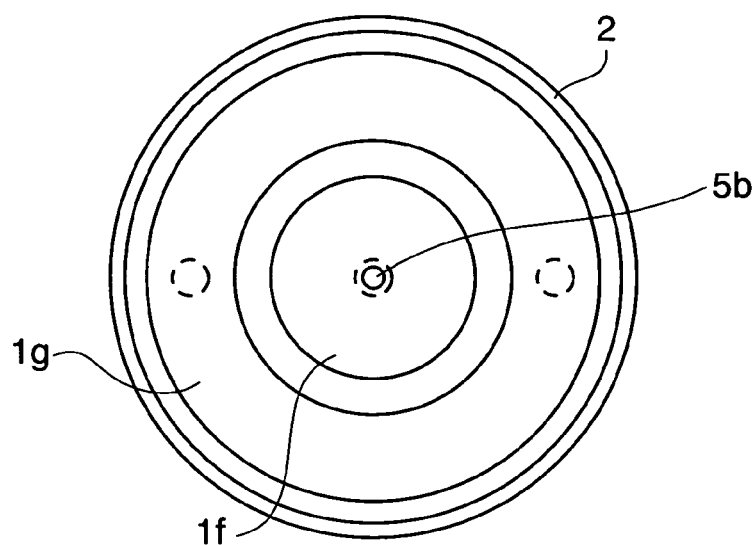
FIG. 17A is a top view showing the constitution of the heating device according to an eleventh embodiment of the present invention.
Figure 17B:
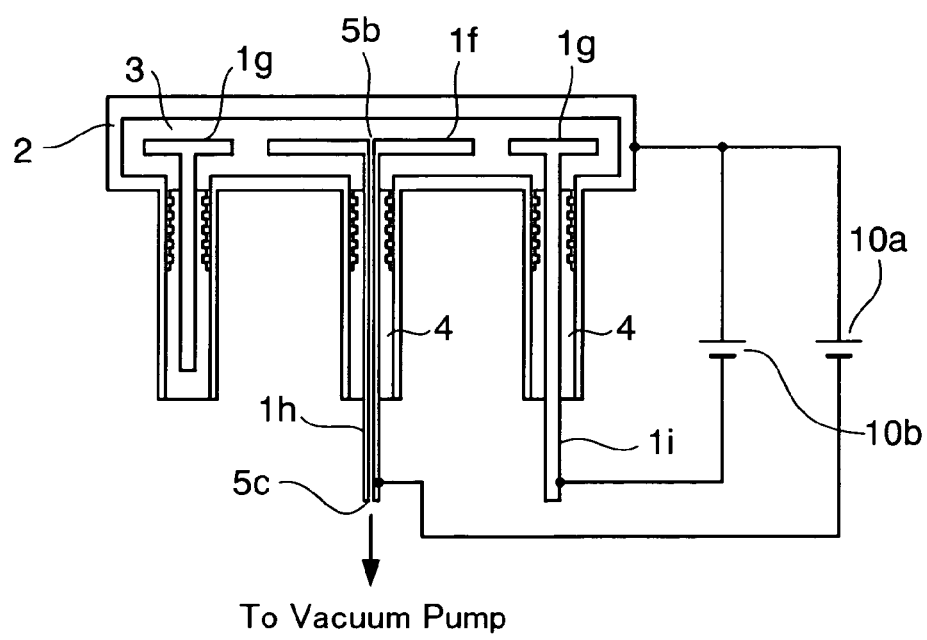
FIG. 17B is a side sectional view thereof.

FIG. 17A is the top view showing the heating device of the eleventh embodiment of the present invention. FIG. 17B is the side sectional view of the heating device.

As shown in FIGS. 17A and 17B, it is the same as the first embodiment of FIG. 1 on the point that the anode electrode 2 is provided so as to surround a disc-shaped conductive plate (plate-shaped conductive substance) 1f that is in the discharging space and serves as the cathode electrode. On the other hand, it is different on the point that a doughnut-shaped conductive substance (plate-shaped conductive substance) 1g, which serves as the cathode electrode, is provided between the anode electrode 2 and the disc-shaped conductive plate 1f so as to surround the disc-shaped conductive plate 1f.

In this case, the disc-shaped conductive plate 1f and the doughnut-shaped conductive plate 1g are severally led out independently from each other via column-shaped conductive rods (post-shaped conductive substance) 1h, 1i. Different power sources 10a, 10b are connected between the disc-shaped conductive plate if and the anode electrode 2, and between the doughnut-shaped conductive plate 1g and the anode electrode 2, respectively. Then, in the lead-out portion of the column-shaped conductive rod 1i connected to the doughnut-shaped conductive plate 1g, the space 3 is isolated from outside air by the insulator 4 similar to the lead-out portion of the column-shaped conductive rod 1h. Only the column-shaped conductive rod 1h connected to the disc-shaped conductive plate 1f is provided with the exhaust pipe 5a whose one end is the exhaust port 5c and the other end is open to the discharging space 3. In some cases, the column-shaped conductive rod 1i connected to the doughnut-shaped conductive plate 1g may be provided with the exhaust pipe whose one end is the exhaust port and the other end is open to the discharging space.

Note that the reference numerals of FIGS. 17A and 17B shown in the same reference numerals of FIG. 1 denote the same items as those in FIG. 1.

Moreover, the partition wall 2b that serves as a support post as shown in FIG. 8 may be provided for partitioning the disc-shaped conductive plate 1f and the doughnut-shaped conductive plate 1g.

According to the above-described eleventh embodiment, the different power sources 10a, 10b can be connected individually to the disc-shaped conductive plate 1f and the doughnut-shaped conductive plate 1g, so that it is possible to control discharging current independently. So-called zone heating can be performed. Thus, it is possible to control increasing temperature, maintaining temperature and decreasing temperature while revision is performed for ununiformity of temperature at an inner part and an outer part on the surface of the anode electrode 2.

Figure 18:
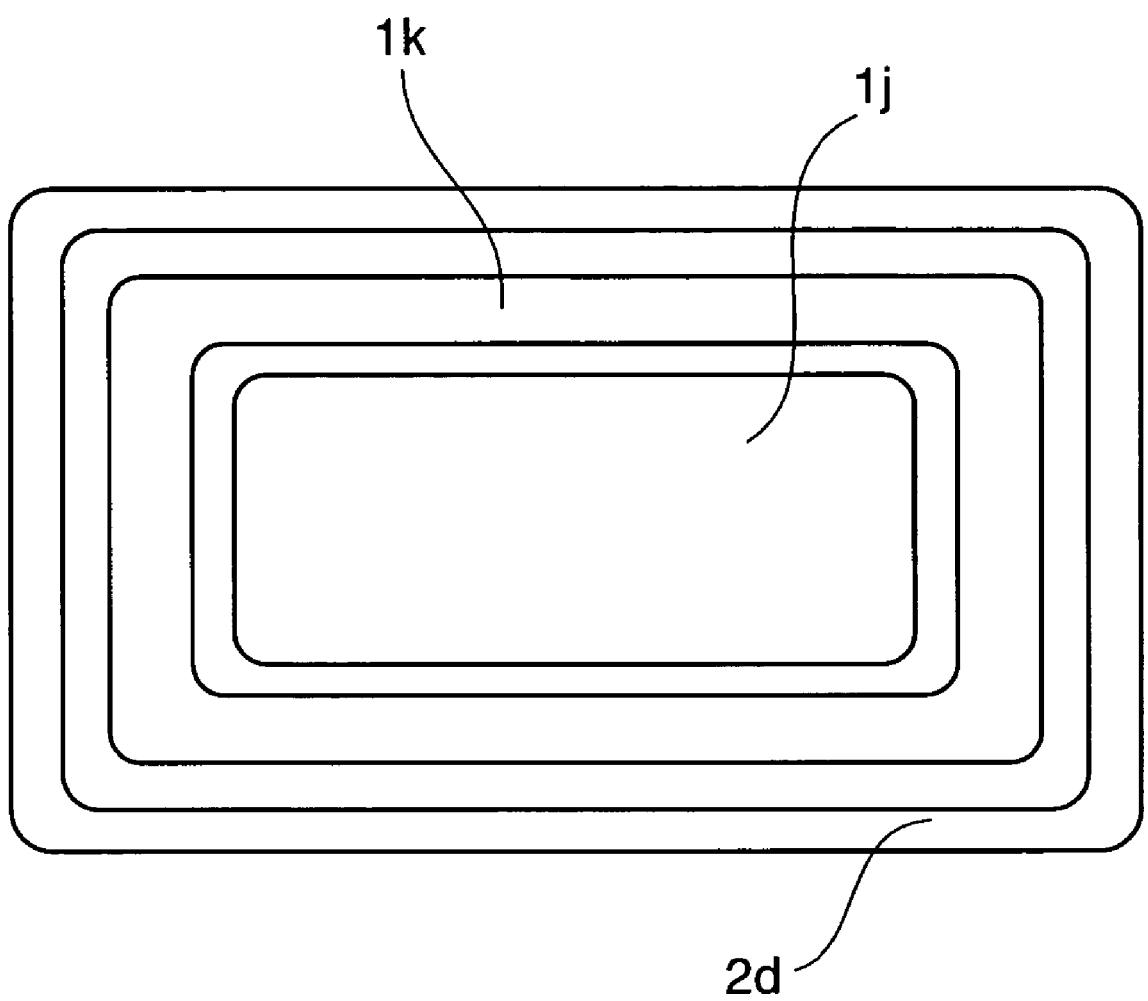
FIG. 18 is a top view showing the constitution of another heating device according to the eleventh embodiment of the present invention.

Further, FIG. 18 is the top view showing another heating device of the eleventh embodiment of the present invention. Although the structure of this embodiment is applied to the heating device whose substrate mount section is a disc shape in FIG. 17B, the structure is applied to a heating device whose substrate mount section is a square shape in FIG. 18.

The heating device of FIG. 18 uses a square-shaped conductive plate 1j instead of the disc-shaped conductive plate 1f shown in FIG. 17A, and a square doughnut-shaped conductive plate 1k is used corresponding to the square-shaped conductive plate 1j instead of the doughnut-shaped conductive plate 1g surrounding the disc-shaped conductive plate 1f. Furthermore, an anode electrode 2d surrounding the square-shaped conductive plate 1j and the doughnut-shaped conductive plate 1k is also in a square box shape according to those shapes.

Since the substrate mount section has the square shape in the heating device of FIG. 18, it is particularly suitable for treatment associated with the heating of a square-shaped large-sized substrate such as a TFT substrate of a liquid crystal display device, for example.

As described above, the present invention has been explained in detail according to the embodiments, but the scope of the invention is not limited to the examples specifically shown in the above-described embodiments, and modifications of the above-described embodiments without departing from the gist of the invention is included in the range of the present invention.

For example, in the above-described embodiments, the shapes of the cathode electrodes or the first electrodes (first conductive substance) 1, 21, 31, 31a, 41, 51, 61 are in the flat-plate shape, the inverse concave shape or the vessel shape, and the anode electrodes or the second electrodes (second conductive substance) 2, 22, 32, 32a, 42, 52, 62 are provided while being adapted for the shapes. However, the shapes of the cathode electrodes or the first electrodes, and the anode electrodes or the second electrodes are not limited to them. As an example, a structural body is acceptable, wherein the anode electrodes or the second electrodes (second conductive substance) is a spherical shape whose inside is the discharging space, and the cathode electrodes or the first electrodes (first conductive substance) is a small spherical shape located at the center of the sphere. In this case, to connect to an outside power source, a cathode terminal can be led outside the sphere by a rod-shaped leading electrode connecting to the small sphere such that the terminal does not contact the anode electrode and the discharging space in the sphere is isolated from outside.

Further, regarding the interval between the cathode electrodes or the first electrodes (first conductive substance) 1, 21, 31, 31a, 41, 51, 61 and the anode electrodes or the second electrodes (second conductive substance) 2, 22, 32, 32a, 42, 52, 62, it is not limited to the interval specifically described in the embodiments. Any interval is acceptable as long as glow discharge is generated when power is applied between the cathode electrodes or the first electrodes (first conductive substance) and the anode electrodes or the second electrodes (second conductive substance).

Furthermore, although the heating devices of FIG. 12 and FIG. 15 do not comprise the exhaust port and the gas supply port for the space isolated from outside air, they may comprise an exhaust port exhausting the space 34, 54 isolated from outside air between the first electrode 31, 51 and the second electrode 32, 52 and a gas supply port introducing gas for electric discharge into the space. In this case, when the exhaust pipe or the like connected to the exhaust port or the like is a conductive substance, the exhaust pipe or the like may be insulated severally from the first electrode 31, 51 and the second electrode 32, 52, or may be insulated from one of the first electrode 31, 51 and the second electrode 32, 52 to prevent the first electrode 31, 51 and the second electrode 32, 52 from contacting each other.

As described above, the first heating device of the invention comprises a first conductive substance and a second conductive substance provided so as to surround the first conductive substance to form the space isolated from outside air therein. The space in the second conductive substance is not decompressed and the device has the exhaust port for decompressing the space. Further, the heating device may be provided, in addition to the exhaust port, with the gas supply port that supplies gas for electric discharge, which is at least one of helium, neon, argon, krypton, xenon, hydrogen, nitrogen, carbon dioxide or air for example, into the space isolated from outside air.

In the first heating device, since the space in the second conductive substance is not previously decompressed, decompression is performed by exhausting the space isolated from outside air from the exhaust port while supplying gas for electric discharge from the gas supply port, or simply by exhausting there from the exhaust port, and then direct current or alternating current power is applied to cause electric discharge of the gas in the decompressed space, and the discharge is maintained. The temperature of the first and second conductive substances increases by maintaining the discharge. Furthermore, when the temperature exceeds temperature equivalent to the work function of the material of the conductive substance used as the cathode electrode, hot electrons are automatcally emitted from the material, and temperature can be increased to high-temperature close to the melting point of the anode electrode due to synergy effect with the discharging current.

Therefore, by using the second conductive substance exposed to outside air as the heating means, it is possible to heat the substrate at the high-temperature of 1000° C. or higher. Further, the second conductive substance can be used as the mount section for the substrate, and there can be provided the heating device suitable for substrate-heating in the single wafer type apparatus for manufacturing semiconductor device.

Furthermore, since electric discharge of gas is caused mainly in the space to generate electrons and ions, the two-electrode constitution is sufficient for electrode constitution, and 100% of input power can be converted into heat with the minimum electrode constitution. In addition, because energy is directly imparted to the second conductive substance, which is the means for heating the object, by the electrons and ions, the thermal conversion efficiency of energy is good. This realizes power saving and makes the device smaller.

Moreover, the device uses energy conversion by the collision of electrons and ions generated in the space between the first conductive substance and the second conductive substance. Therefore, by adjusting the shapes of the first and second conductive substance, discharge intensity can be adjusted, and thus it is possible to adjust the collision distribution of electrons relatively easily. Consequently, temperature distribution having high uniformity can be obtained relatively easily.

Unlike the first heating device, the second heating device of the invention is not provided with the exhaust port and the space isolated from outside air is previously decompressed. Direct current or alternating current power is applied between the first conductive substance and the second conductive substance to cause electric discharge of gas in the decompressed space, the discharge is maintained, and thus the temperature of the first and second conductive substances increases. Out of the conductive substances, by using the second conductive substance exposed to outside air as the heating means, the thermal conversion efficiency of energy can be improved, the uniformity of temperature distribution can be increased, and heating temperature can be increased. Moreover, since the space isolated from outside air is previously decompressed, particularly a so-called portable heating device is obtained.

Furthermore, the third heating device of the present invention comprises a structural body, which has the first conductive substance, the second conductive substance being opposed to the first conductive substance and the insulator that insulates the first conductive substance from the second conductive substance, and in which they form the space isolated from outside air. The space inside the structural body is not decompressed, the exhaust port for decompressing the space is provided. Further, the third heating device may be provided, in addition to the exhaust port, with the gas supply port that supplies gas for electric discharge into the space isolated from outside air. The gas is at least one of helium, neon, argon, krypton, xenon, hydrogen, nitrogen, carbon dioxide or air for example, In the third heating device, the space in the structural body is not decompressed. Direct current or alternating current power is applied between the first conductive substance and the second conductive substance after the space isolated from outside air is decompressed, as described in the second heating device, and electric discharge of gas in the decompressed space is caused, and then the discharge is maintained to increase the temperature of the first and second conductive substances. Therefore, by using at least one of the first and second conductive substances as the heating means, the thermal conversion efficiency of energy can be improved, the uniformity of temperature distribution can be increased and the heating temperature can be increased, in the same manner as the first heating device. In addition, since both the first and second conductive substances are exposed to outside air, at least one of the first and second conductive substances can be used as the mount section for the substrate, and thus there can be provided the heating device suitable for substrate-heating in the single wafer type apparatus for manufacturing semiconductor device.

According to the fourth heating device of the invention, the space isolated from outside air is previously decompressed unlike the third heating device, and then direct current or alternating current power is applied between the first conductive substance and the second conductive substance to cause electric discharge of residual gas in the decompressed space, and the discharge is maintained. Then, the temperature of the first and second conductive substances is increased by maintaining the charge. Therefore, by using at least one of the first and second conductive substances as the heating means, the thermal conversion efficiency of energy can be improved, the uniformity of temperature distribution can be increased and the heating temperature can be increased, in the same manner as the third heating device. Still further, since the space isolated from outside air is previously decompressed in the same manner as the second heating device, particularly the so-called portable heating device can be obtained.

What is claimed is:

1. A heating device comprising:
   (a) a first electrode;
   (b) a second electrode including a planar portion providing a support surface for supporting an object to be heated in an external gaseous atmosphere to which the object to be heated and the support surface are exposed, said second electrode formed as an enclosure enclosing and spaced from at least a portion of said first electrode to define an interior space therebetween isolated from the external gaseous atmosphere;
   (c) an exhaust port in communication with the interior space for reducing the pressure within the interior space; and
   (d) a power supply for supplying current between said first and second electrodes and to produce an electric discharge within the internal space, thereby heating the second electrode and the object supported thereon.

2. The heating device according to claim 1 wherein said first electrode includes a disc-shaped portion enclosed by said second electrode and a column-shaped portion supporting said disc-shaped portion.

3. The heating device according to claim 2 comprising a plurality of said first electrodes enclosed within said second electrode.

4. The heating device according to claim 2 wherein said column-shaped portion is hollow and in communication with an opening in said disc-shaped portion for evacuating said interior space.

5. The heating device according to claim 2 further comprising an insulator surrounding said column-shaped portion and providing a seal between said column-shaped portion an a tubular portion of said second electrode surrounding said column-shaped portion.

6. The heating device according to claim 5 wherein said insulator has circumferential groves formed in a portion of its exterior surface spaced from said tubular portion.

7. The heating device according to claim 1 wherein said planar portion of said second electrode has holding means for holding the object to be heated on the support surface by suction.

8. The heating device according to claim 7 wherein said holding means comprises a plurality of apertures extending therethrough.

9. The heating device according to claim 7 wherein said holding means is a porous sintered body within said planar portion.

10. The heating device according to claim 1 wherein said first electrode has a material providing a thermoelectric effect exposed at a surface thereof.

11. The heating device according to claim 1 wherein said first electrode includes a body portion and, on a surface of the body portion, a heat-resistant coating for improving the heat-resistance of said body portion.

12. The heating device according to claim 1 further comprising an adsorbent for selectively adsorbing a gas from within said interior space.

13. The heating device according to claim 1 further comprising a gas supply port for supplying a gas for electric discharge to said interior space.

14. The heating device according to claim 1 wherein said power supply supplies alternating current.

15. The heating device according to claim 1 wherein said power supply supplies direct current.

16. The heating device according to claim 1 further comprising feedback means for controlling said power supply responsive to a detected temperature.

17. The heating device according to claim 1 wherein said first electrode comprises a central disc portion and, surrounding and spaced from said central disc portion, an annular plate portion coplanar with said central disc portion.

18. A method for heating an object by electric discharge comprising:
   providing a first electrode and a second electrode including a planar portion providing a support surface for supporting the object to be heated, said second electrode formed as an enclosure enclosing and spaced from at least a portion of said first electrode to define an interior space therebetween;
   placing the object to be heated on the support surface;
   exposing the object to be heated and the support surface to an exterior atmosphere;
   evacuating the interior space; and
   applying an electric current between the first and second electrodes to produce an electric discharge within the evacuated interior space thereby heating the object supported on the support surface,
   (d) supplying current between said first and second electrodes and producing an electric discharge within the internal space, thereby heating the second electrode and the object supported thereon.

19. The method of claim 18 wherein the pressure of the evacuated interior is 10–1000 Pa.

20. The method of claim 19 wherein the gas is at least one member selected from the group consisting of helium, neon, argon, krypton, xenon, hydrogen, nitrogen, carbon dioxide and air.

21. The method of claim 19 wherein said first electrode is a cathode and said second electrode is an anode.

22. The method of claim 18 further comprising introducing a gas for supporting the electric discharge into the interior space.

23. The method of claim 18 wherein the first electrode is a cathode and the second electrode is an anode.

* * * * *